(12) United States Patent  
Ohguro

(10) Patent No.: US 7,541,649 B2
(45) Date of Patent: Jun. 2, 2009

(54) SEMICONDUCTOR DEVICE HAVING SOI SUBSTRATE

(75) Inventor: Tatsuya Ohguro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 415 days.

(21) Appl. No.: 11/430,984

(22) Filed: May 10, 2006

(65) Prior Publication Data
US 2007/0158746 A1 Jul. 12, 2007

(30) Foreign Application Priority Data
Jan. 12, 2006 (JP) ............... 2006-005054

(51) Int. Cl.
H01L 27/088 (2006.01)
(52) U.S. Cl. ............... 257/368; 257/390; 257/401; 257/E27.081
(58) Field of Classification Search ........... 257/368, 257/390, 401, E27.046, E27.06, E27.081
See application file for complete search history.

(56) References Cited

U.S. PATENT DOCUMENTS 5,895,956 A * 4/1999 Oowaki et al. ............ 257/350
7,208,779 B2 * 4/2007 Ohta et al. ................ 257/207

FOREIGN PATENT DOCUMENTS

| JP | 6-275630 | 9/1994 |
| JP | 7-66411 | 3/1995 |
| JP | 8-213564 | 8/1996 |
| JP | 9-252130 | 9/1997 |
| JP | 2000-196102 | 7/2000 |
| JP | 2000-243967 | 9/2000 |

* cited by examiner

Primary Examiner—Evan Pert
Assistant Examiner—Selim Ahmed
(74) Attorney, Agent, or Firm—Oblon, Spivak, McClelland, Maier & Neustadt, P.C.

(57) ABSTRACT

A semiconductor device includes first semiconductor layers with a first conductivity, second to fifth semiconductor layers with a second conductivity, gate electrodes, and a first wiring layer. The second semiconductor layers are each disposed between adjacent ones of the first semiconductor layers. The third semiconductor layer is in contact with the second semiconductor layers. The gate electrodes are formed on the second semiconductor layers. The fourth semiconductor layer is in contact with the third semiconductor layer. The first wiring layer is formed on the third semiconductor layer and commonly connects the gate electrodes. The length of the fourth semiconductor layer in the lengthwise direction is smaller than the length of the third semiconductor layer in the lengthwise direction. The fifth semiconductor layer is in contact with the fourth semiconductor layer and isolated from the first semiconductor layers by the fourth semiconductor layer.

15 Claims, 27 Drawing Sheets

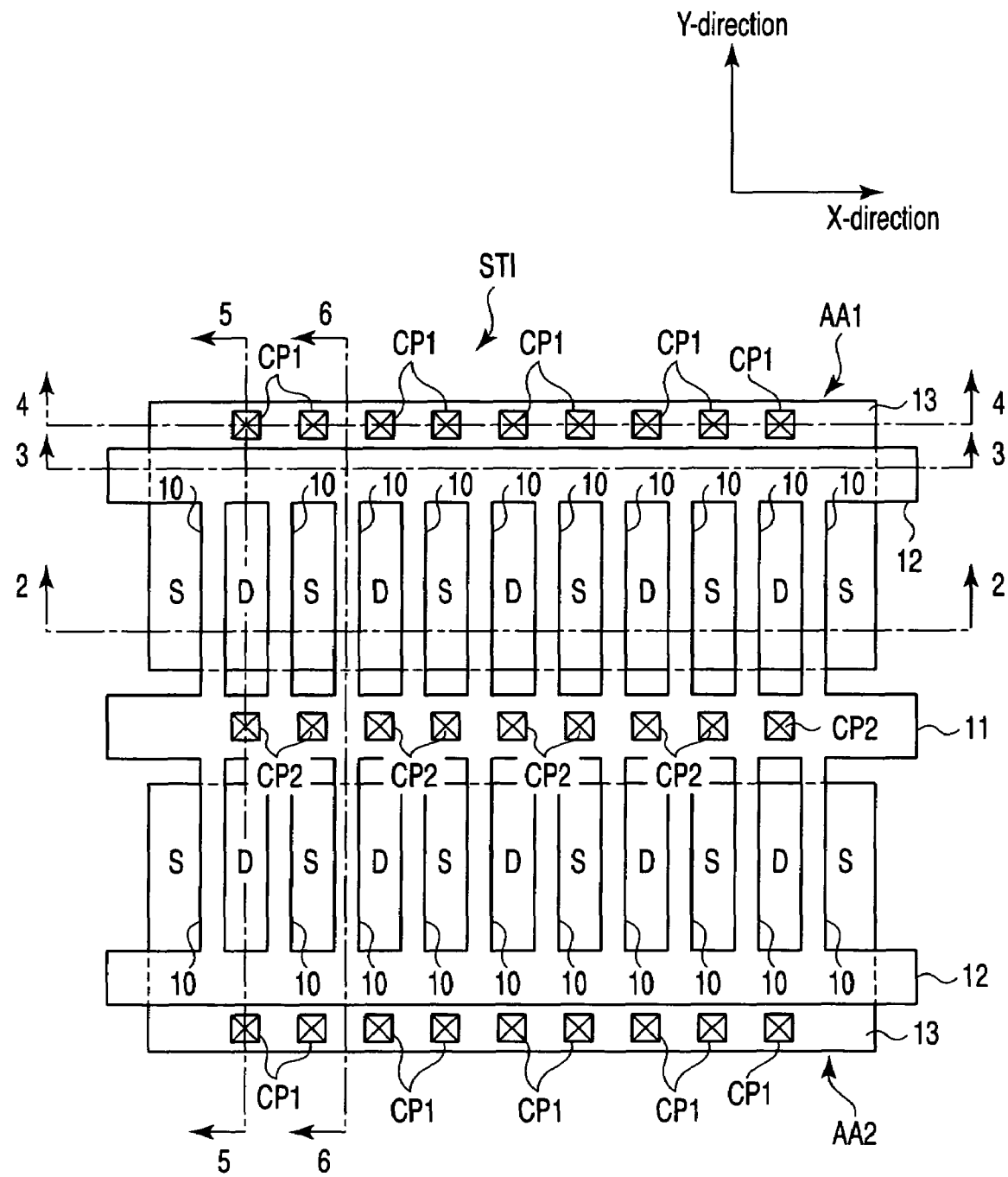
F I G. 1

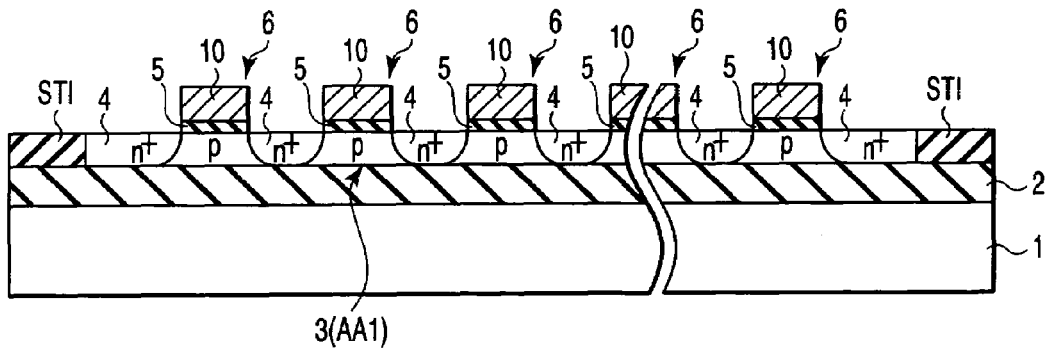
F I G. 2
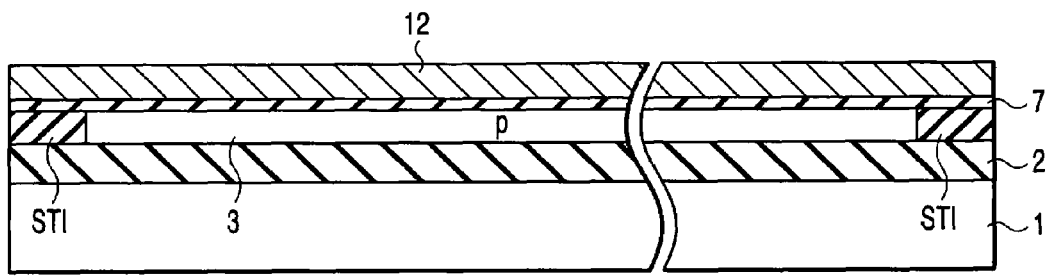
F I G. 3
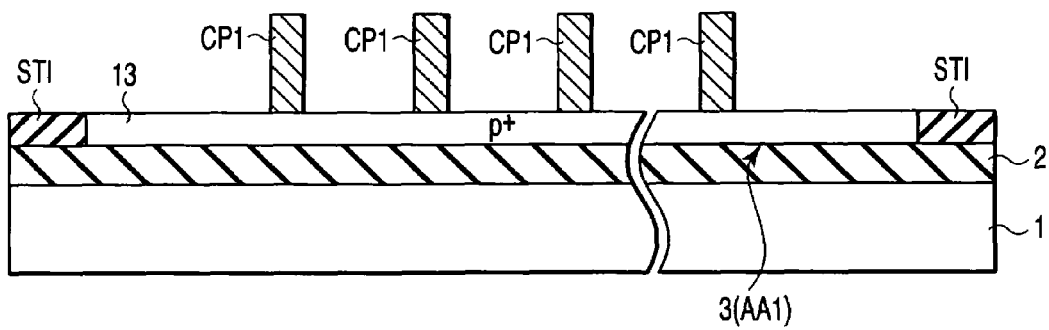
F I G. 4

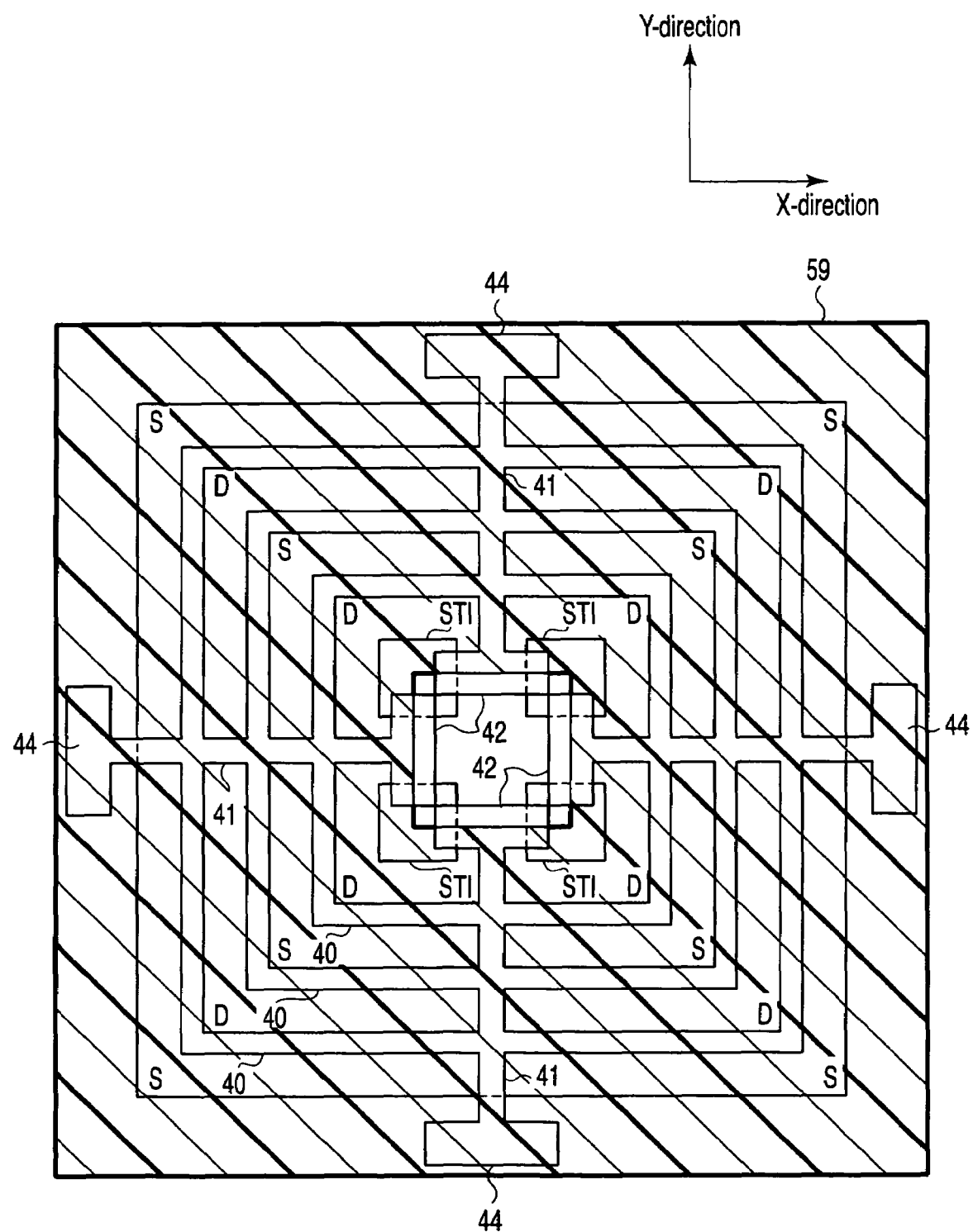
F I G. 31

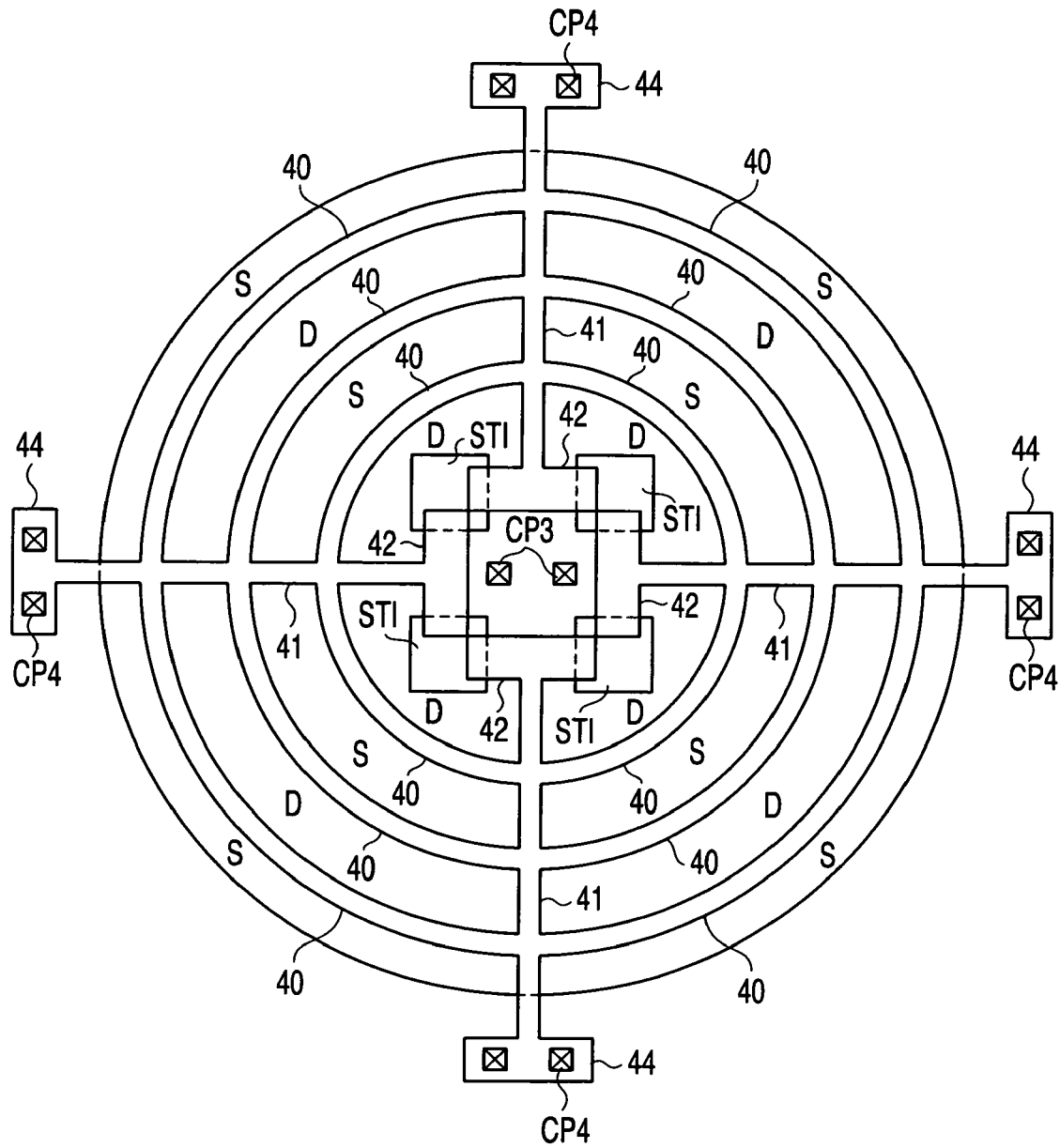
F I G. 3 2

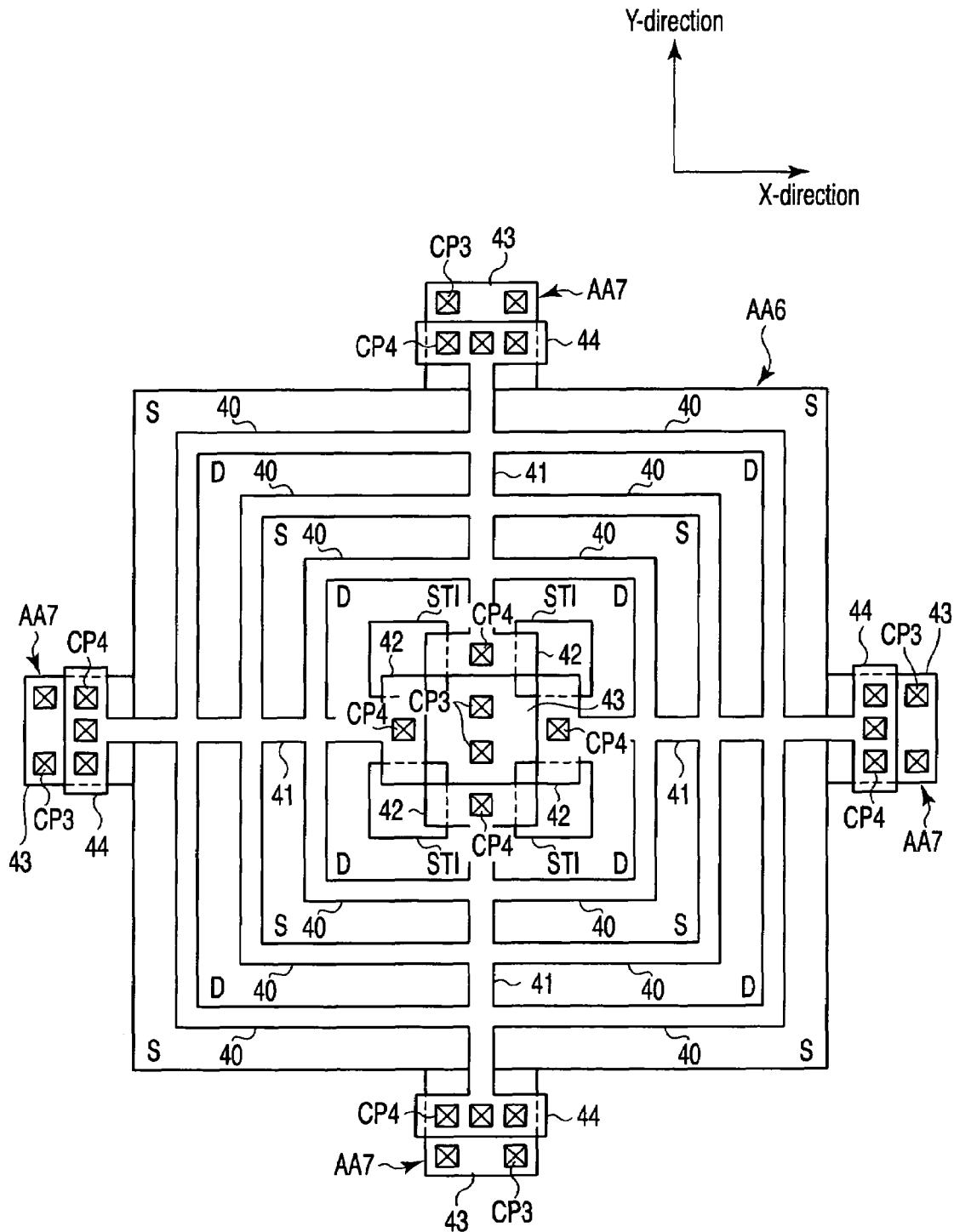
F I G. 33

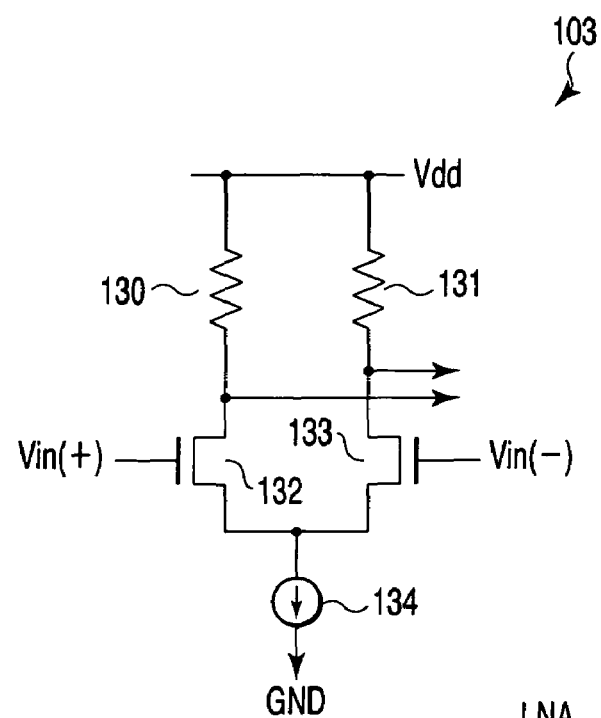
F I G. 4 2    LNA
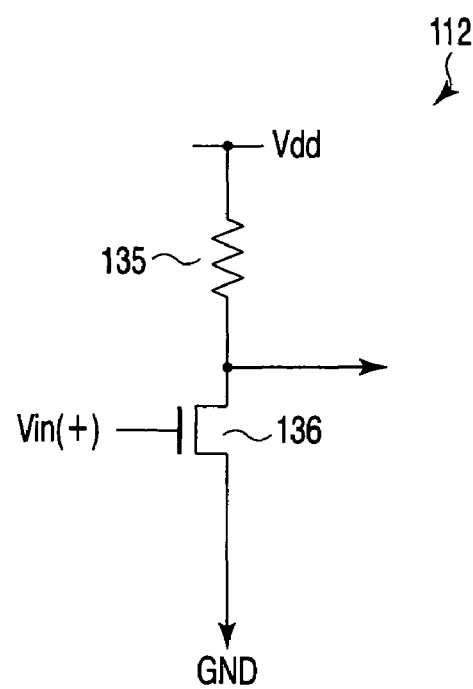
F I G. 4 3    PA

SEMICONDUCTOR DEVICE HAVING SOI SUBSTRATE

CROSS-REFERENCE TO RELATED APPLICATIONS

This application is based upon and claims the benefit of priority from prior Japanese Patent Application No. 2006-005054, filed Jan. 12, 2006, the entire contents of which are incorporated herein by reference.

BACKGROUND OF THE INVENTION

1. Field of the Invention

This invention relates to a semiconductor device and, for example, this invention relates to the structure of MOS transistors formed on an SOI (Silicon On Insulator) substrate.

2. Description of the Related Art

The SOI structure is conventionally well known as the structure having a silicon layer formed on an insulating film. The parasitic capacitance of a semiconductor element formed on the SOI structure is small and the operation speed thereof can be made high. Therefore, it is expected that the performance of LSIs is further enhanced by using the SOI structure.

However, a MOS transistor formed on the SOI structure causes a peculiar operation phenomenon in some cases because the potential of a body region in which the channel is formed is set in an electrically floating state. The phenomenon is called a floating body effect. The floating body effect has a problem that variations in the threshold voltage and leak current in the semiconductor element are caused. Therefore, various proposals are made to suppress the floating body effect. The proposals are disclosed in Jpn. Pat. Appln. KOKAI Publication No. H6-275630, Jpn. Pat. Appln. KOKAI Publication No. H7-66411, Jpn. Pat. Appln. KOKAI Publication No. H8-213564 and Jpn. Pat. Appln. KOKAI Publication No. H9-252130, for example.

Further, a comb structure is widely used for an analog CMOS circuit. By using the comb structure, MOS transistors excellent in the current supplying ability can be formed to save the space. However, when the comb structure is applied to the SOI structure, the way how to suppress the floating body effect has not been conventionally proposed.

BRIEF SUMMARY OF THE INVENTION

A semiconductor device according to an aspect of the present invention includes: a first insulating film formed on a semiconductor substrate;

a plurality of first semiconductor layers of a first conductivity type separately formed on the first insulating film;

a plurality of second semiconductor layers of a second conductivity type which is opposite to the first conductivity type, formed on the first insulating film, each disposed between adjacent ones of the first semiconductor layers and formed in contact with the first semiconductor layers;

a third semiconductor layer of the second conductivity type formed on the first insulating film and formed in contact with the plurality of second semiconductor layers;

a plurality of gate electrodes formed on the second semiconductor layers with gate insulating films interposed therebetween;

a first wiring layer formed on the third semiconductor layer with a second insulating film interposed therebetween and commonly connecting the plurality of gate electrodes;

a fourth semiconductor layer of the second conductivity type formed on the first insulating film, the fourth semiconductor layer being in contact with at least the third semiconductor layer, a length of the fourth semiconductor layer in a lengthwise direction being smaller than a length of the third semiconductor layer in a lengthwise direction;

a fifth semiconductor layer of the second conductivity type formed on the first insulating film and isolated from the first semiconductor layers by the fourth semiconductor layer, the fifth semiconductor layer being in contact with the fourth semiconductor layer, the first to fifth semiconductor layers being electrically isolated from the semiconductor substrate by the first insulating film;

a second wiring layer formed on the fourth semiconductor layer with a third insulating film interposed therebetween; and a first contact plug formed on the fifth semiconductor layer.

BRIEF DESCRIPTION OF THE SEVERAL VIEWS OF THE DRAWING

FIG. 1 is a plan view of a CMOS circuit according to a first embodiment of this invention;

FIG. 2 is a cross sectional view taken along the 2-2 line of FIG. 1;

FIG. 3 is a cross sectional view taken along the 3-3 line of FIG. 1;

FIG. 4 is a cross sectional view taken along the 4-4 line of FIG. 1;

FIG. 31 is a plan view showing the CMOS circuit according to the fourth embodiment of this invention and showing the state at the time of the ion-implantation process;

FIG. 32 is a plan view of a CMOS circuit according to a first modification of the fourth embodiment of this invention;

FIG. 33 is a plan view of a CMOS circuit according to a second modification of the fourth embodiment of this invention;

FIG. 42 is a circuit diagram of a low-noise amplifier having the CMOS circuit according to the first to fourth embodiments of this invention; and FIG. 43 is a circuit diagram of a power amplifier having the CMOS circuit according to the first to fourth embodiments of this invention.

DETAILED DESCRIPTION OF THE INVENTION

Figure 5:
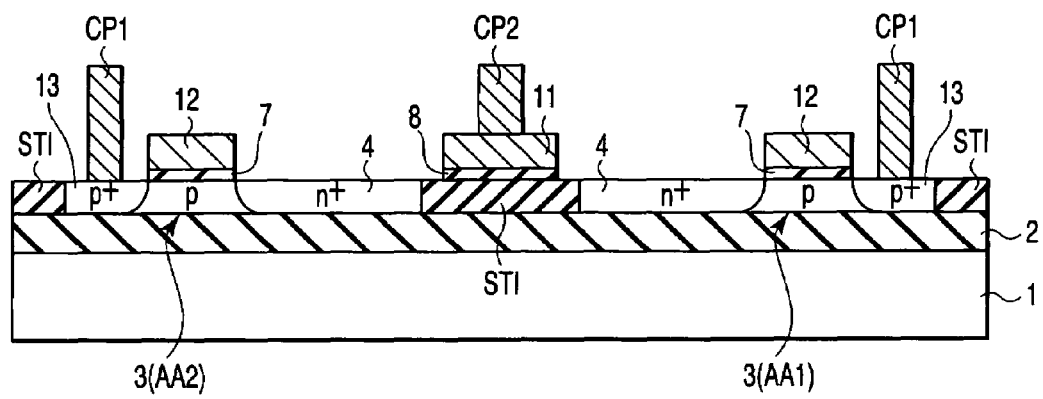
FIG. 5 is a cross sectional view taken along the 5-5 line of FIG. 1.

There will now be described a semiconductor device according to a first embodiment of this invention with reference to FIG. 1. FIG. 1 is a plan view of an analog CMOS circuit according to the present embodiment.

As shown in FIG. 1, the CMOS circuit includes two element regions AA1, AA2. The element regions AA1, AA2 are p-type semiconductor regions formed on an insulating film which is formed on a semiconductor substrate (not shown). The two element regions AA1, AA2 are separated from each other and arranged to extend in a Y direction. The element regions AA1, AA2 are surrounded by an element isolation region STI and the element regions AA1 and AA2 are electrically isolated from each other by the element isolation region STI. A plurality of stripe-shaped gate electrodes 10 are formed to extend in a Y direction on the element regions AA1, AA2 with gate insulating films (not shown) disposed therebetween. The gate electrodes 10 are arranged in an X direction which is perpendicular to the Y direction. One-side ends of the gate electrodes 10 in the lengthwise direction are lead out from the element regions AA1, AA2 to a portion on the element isolation region STI and commonly connected to a wiring layer 11. The wiring layer 11 is formed on the element isolation region STI and has a stripe form extending in the X direction. Further, the other ends of the gate electrodes 10 in the lengthwise direction are respectively located on the element regions AA1, AA2 and commonly connected to respective wiring layers 12 formed on the element regions AA1, AA2. Like the gate electrode 10, the wiring layers 12 are respectively formed on the element regions AA1, AA2 with insulating films (not shown) disposed therebetween and each have a stripe form extending in the X direction. One end of each of the wiring layers 12 reaches one end of a corresponding one of the element regions AA1, AA2 along the X direction and the other end thereof reaches the other end of the corresponding one of the element regions AA1, AA2 along the X direction. That is, the wiring layers 12 are formed to respectively cross the element regions AA1, AA2 along the X direction.

In the element regions AA1, AA2, $n^+$-type impurity diffusion layers are formed in regions which lie on both sides of the gate electrodes 10 in the X direction. The $n^+$-type impurity diffusion layers function as source and drain regions of MOS transistors. In FIG. 1, regions indicated by "S" are regions in which the $n^+$-type impurity diffusion layers functioning as the source regions are formed and regions indicated by "D" are regions in which the $n^+$-type impurity diffusion layers functioning as the drain regions are formed. The $n^+$-type impurity diffusion layers are not formed in regions which lie directly below the gate electrodes 10 and wiring layers 12 and the regions function as p-type well regions. Further, in the element regions AA1, AA2, $p^+$-type impurity diffusion layers 13 are formed in regions outside the respective wiring layers 12, that is, in regions which face the wiring layer 11 with the respective wiring layers 12 disposed therebetween. Thus, the $p^+$-type impurity diffusion layers 13 are electrically connected to the p-type well regions. Further, a plurality of contact plugs CP1 are formed on the respective $p^+$-type impurity diffusion layers 13. The contact plugs CP1 are used to apply potential to the p-type well regions. A plurality of contact plugs CP2 are formed on the wiring layer 11. The contact plugs CP1 are used to apply potential to the gate electrodes 10.

Next, the cross sectional structure of the analog CMOS circuit with the above configuration is explained with reference to FIGS. 2 to 6. FIGS. 2 to 6 are cross sectional views taken along the 2-2 line, 3-3 line, 4-4 line, 5-5 line and 6-6 line of FIG. 1. In the cross sectional structures taken along the 2-2 line, 3-3 line and 4-4 line, only the element region AA1 is shown, but the element region AA2 is also formed to have the same structure.

First, the cross sectional structure taken along the 2-2 line is explained with reference to FIG. 2. As shown in FIG. 2, an insulating film 2 is formed on a semiconductor substrate 1. The insulating film 2 is formed of a silicon oxide film or the like, for example. A p-type semiconductor layer 3 is formed on the insulating film 2 and an element isolation region STI is formed to surround the semiconductor layer 3 to such depth as to reach the insulating film 2. A portion of the semiconductor layer 3 which is surrounded by the element isolation region STI is used as an element region AA1. In the semiconductor layer 3, a plurality of $n^+$-type impurity diffusion layers 4 are separately formed to extend from the surface of the semiconductor layer 3 to the insulating film 2. The $n^+$-type impurity diffusion layers 4 function as the source (S) and drain (D) regions. The gate electrodes 10 are formed on portions of the semiconductor layer 3 which each lie between the adjacent diffusion layers 4 with gate insulating films 5 disposed therebetween. With the above structure, the $n^+$-type impurity diffusion layers 4 and gate electrodes 10 form MOS transistor units 6. Therefore, adjacent ones of the MOS transistor units 6 commonly use the source or drain region. Regions of the semiconductor layer 3 in which the source and drain regions are not formed function as body regions of the MOS transistor units 6. The MOS transistor units 6 are combined and function as one large MOS transistor.

Next, the cross sectional structure taken along the 3-3 line is explained with reference to FIG. 3. As shown in FIG. 3, the p-type semiconductor layer 3 is formed on the insulating film 2 on the semiconductor substrate 1. The wiring layer 12 is formed on the semiconductor layer 3 with an insulating film 7 disposed therebetween. The wiring layer 12 is formed to completely cover the semiconductor layer 3. Unlike the case of FIG. 2, $n^+$-type impurity diffusion layers are not formed in a portion of the semiconductor layer 3 which lies directly below the wiring layer 12 and the portion is in contact with the p-type body regions of the MOS transistor units 6.

Next, the cross sectional structure taken along the 4-4 line is explained with reference to FIG. 4. As shown in FIG. 4, the $p^+$-type impurity diffusion layer 13 is formed on the insulating film 2 on the semiconductor substrate 1. The $p^+$-type impurity diffusion layer 13 is in contact with the semiconductor layer 3 shown in FIG. 3. The contact plugs CP1 are formed on the $p^+$-type impurity diffusion layer 13.

Next, the cross sectional structure taken along the 5-5 line is explained with reference to FIG. 5. As shown in FIG. 5, the insulating film 2 is formed on the semiconductor substrate 1. The semiconductor layer 3 is formed on the insulating film 2 and the element isolation region STI which surrounds and divides the semiconductor layer 3 is formed to such depth as to reach the insulating film 2. Portions of the semiconductor layer 3 surrounded and divided by the element isolation region STI are used as the element regions AA1, AA2. On the element isolation region STI which lies between the element regions AA1 and AA2, the wiring layer 11 is formed with an insulating film 8 disposed therebetween. Further, the contact plugs CP2 are formed on the wiring layer 11. In the semiconductor layer 3, the $n^+$-type impurity diffusion layers 4 and $p^+$-type impurity diffusion layers 13 are separately formed. The diffusion layers 4 are formed to extend from the surface of the semiconductor layer 3 to the insulating layer 2. On portions of the semiconductor layer 3 which lie between the diffusion layers 4 and 13, the wiring layers 12 are formed with the insulating films 7 disposed therebetween. The diffusion layers 4 are formed between the wiring layers 12 and 11 and the diffusion layers 13 are formed in opposition to the diffusion layers 4 with the wiring layers 12 disposed therebetween.

Figure 6:
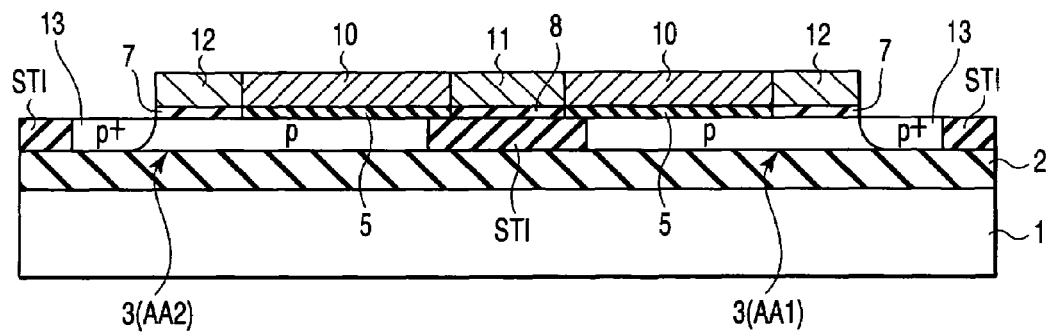
FIG. 6 is a cross sectional view taken along the 6-6 line of FIG. 1.

Next, the cross sectional structure taken along the 6-6 line is explained with reference to FIG. 6. Like the case of FIG. 5, the wiring layers 11, 12 are formed on the semiconductor layer 3. The gate electrodes 10 are formed on portions of the semiconductor layer 3 which lie between the wiring layers 11 and 12 with gate insulating films 5 disposed therebetween. The gate electrode 10 is formed to reach the wiring layer 11 at one end and reach the wiring layer 12 at the other end. Further, $n^+$-type impurity diffusion layers 4 are not formed in portions of the semiconductor layer 3 which lie directly below the gate electrodes 10 and the portions function as the body regions of the MOS transistor units 6.

As described above, according to the analog CMOS circuit of the present embodiment, the following effect (1) can be attained.

(1) The floating body effect in the analog CMOS circuit using the SOI structure can be suppressed.

With the structure according to the present embodiment, potentials can be applied to the body regions of the MOS transistor units 6 via the $p^+$-type impurity diffusion layers 13. Therefore, it becomes possible to prevent the body regions of the MOS transistor units 6 from being set into an electrically floating state and suppress occurrence of the floating body effect.

Further, the wiring layers 12 are formed on the element regions AA1, AA2. Generally, it is common practice to form silicide films on the source and drain regions in order to lower the resistances thereof. The formation process of the silicide film is roughly described as follows. First, gate electrodes and source and drain regions are formed. Then, a metal layer is formed on the entire surface of the resultant structure. Next, the heat treatment process is performed. As a result, silicide films are formed on the surfaces of the gate electrodes and the source and drain regions by reaction of silicon and metal. At this time, occurrence of an electrical short circuit is prevented by forming a side wall insulating film on the gate side wall. Based on the above manufacturing method, when a plurality of regions to which different voltages are applied are present, it is necessary to form the silicide films on the respective regions so as not to be formed in contact with one another. For example, a gate electrode lies between the source and drain regions. Therefore, since the silicide films are separated from each other by the presence of a region in which the gate electrode is formed, the source and drain regions can be prevented from being short-circuited. This applies to a portion between the $p^+$-type impurity diffusion layers 13 and the source and drain regions. If contact portions between the $p^+$-type impurity diffusion layers 13 and the source and drain regions are exposed at the time of formation of the metal layer, the silicide films on the source and drain regions and the silicide films on the $p^+$-type impurity diffusion layers 13 are short-circuited to each other. Therefore, in the present embodiment, as shown in FIG. 1, the wiring layers 12 are formed to separate the $p^+$-type impurity diffusion layers 13 from the source and drain regions. As a result, the silicide films on the source and drain regions and the silicide films on the $p^+$-type impurity diffusion layers 13 are separated from each other by the presence of the wiring layer 12 and can be prevented form being short-circuited.

Figure 7:
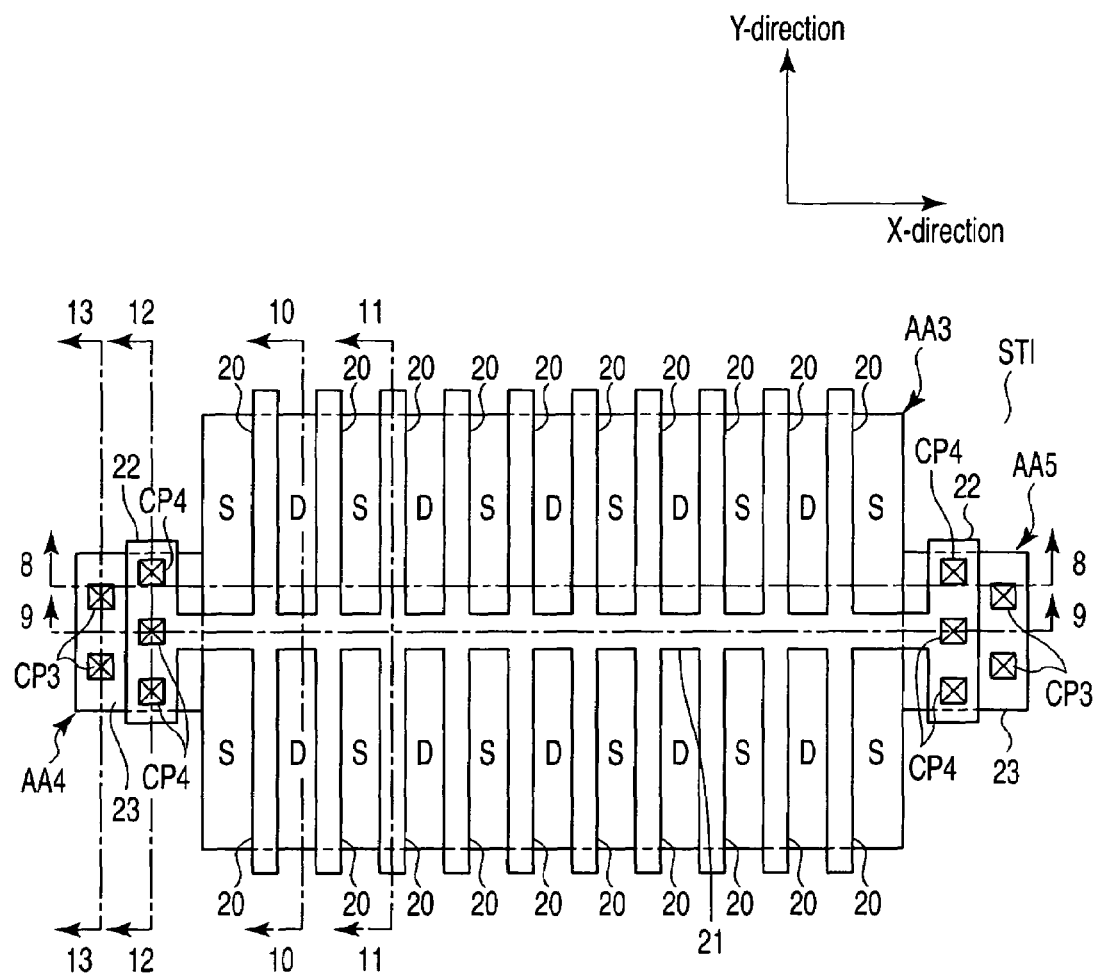
FIG. 7 is a plan view of a CMOS circuit according to a second embodiment of this invention.

Next, a semiconductor device according to a second embodiment of this invention is explained with reference to FIG. 7. In this embodiment, the positions of the contact plugs used to apply potentials to the body regions in the first embodiment are changed. FIG. 7 is a plan view showing an analog CMOS circuit according to the present embodiment.

As shown in FIG. 7, the CMOS circuit has three element regions AA3 to AA5. The element regions AA3 to AA5 are p-type semiconductor layers formed on an insulating film formed on a semiconductor substrate (not shown). The element region AA4 is formed in contact with one end of the element region AA3 in an X direction and the element region AA5 is formed in contact with the other end of the element region AA3 in the X direction. The element regions AA3 to AA5 are surrounded by an element isolation region STI. On the element region AA3, a plurality of stripe-form gate electrodes 20 which extend in a Y direction perpendicular to the X direction are formed with gate insulating films (not shown) disposed therebetween. The plurality of gate electrodes 20 are arranged in parallel in the X direction. One-side ends of the gate electrodes 20 in the lengthwise direction are extended to one end of the element region AA3 in the Y direction and the other ends of the gate electrodes 20 in the lengthwise direction are extended to the other end of the element region AA3 in the Y direction. Further, the gate electrodes 20 are commonly connected to a wiring layer 21. Like the gate electrodes 20, the wiring layer 21 is formed on the element region AA3 with a gate insulating film (not shown) disposed therebetween and has a stripe form extending in the X direction. Further, the wiring layer 21 is so formed that one end thereof in the lengthwise direction is extended onto the element region AA4 and the other end thereof is extended onto the element region AA5. That is, the wiring layer 21 is formed to cross the element region AA3 in the X direction. Wiring layers 22 are respectively formed on the element regions AA4, AA5 in parallel to the gate electrodes 20 with insulating films (not shown) disposed therebetween. That is, each of the wiring layers 22 has a stripe form extending in the Y direction. The wiring layers 22 are so formed that one-side ends thereof in the Y direction respectively reach one-side ends of the element regions AA4, AA5 in the Y direction and the other ends thereof in the Y direction respectively reach the other ends of the element regions AA4, AA5 in the Y direction. That is, the wiring layers 22 are formed to respectively cross the element regions AA4, AA5 in the Y direction.

In the element regions AA3 to AA5, $n^+$-type impurity diffusion layers are formed in regions which lie on both sides of the gate electrodes 20 in the X direction. The $n^+$-type impurity diffusion layers function as source and drain regions of MOS transistors. In FIG. 7, regions indicated by "S" are regions in which the $n^+$-type impurity diffusion layers functioning as the source regions are formed and regions indicated by "D" are regions in which the $n^+$-type impurity diffusion layers functioning as the drain regions are formed. The $n^+$-type impurity diffusion layers are not formed in regions which lie directly below the gate electrodes 20 and wiring layers 21, 22 and the regions function as p-type well regions. Further, in the element regions AA4, AA5, $p^+$-type regions 23 are formed in regions outside the respective wiring layers 22, that is, in regions which face the gate electrodes 20 with the respective wiring layers 22 disposed therebetween. Further, a plurality of contact plugs CP3 is formed on the respective $p^+$-type regions 23. The contact plugs CP3 are used to apply potential to the p-type well regions. A plurality of contact plugs CP4 are formed on the wiring layers 22. The contact plugs CP4 are used to apply potential to the gate electrodes 20.

Next, the cross sectional structure of the analog CMOS circuit with the above configuration is explained with reference to FIGS. 8 to 13. FIGS. 8 to 13 are cross sectional views taken along the 8-8 line, 9-9 line, 10-10 line, 11-11 line, 12-12 line and 13-13 line of FIG. 7.

Figure 8:
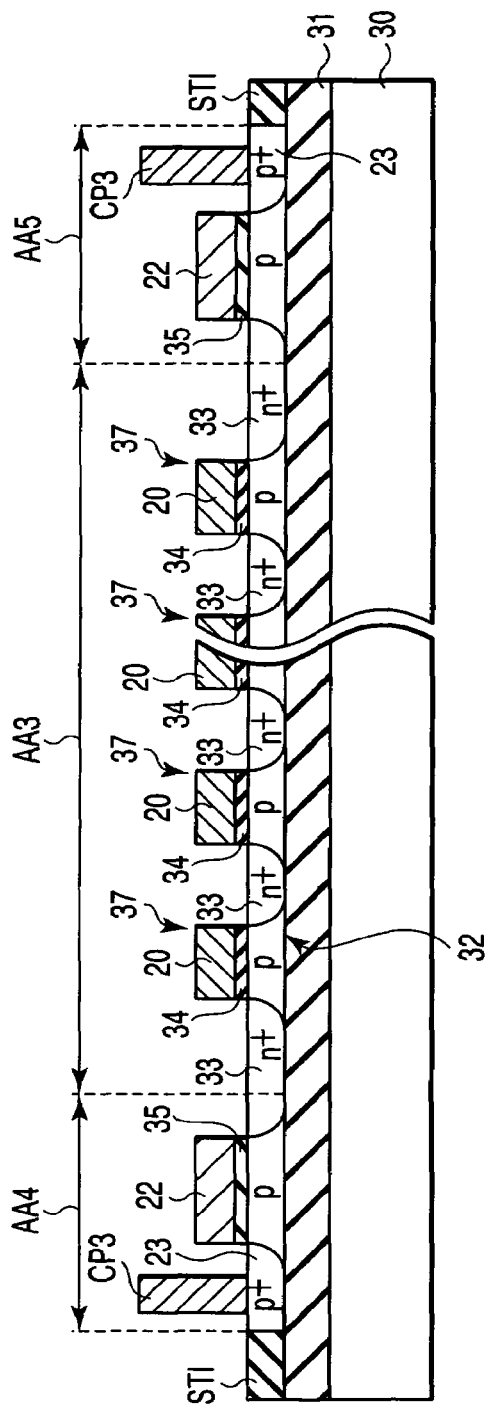
FIG. 8 is a cross sectional view taken along the 8-8 line of FIG. 7.

First, the cross sectional structure taken along the 8-8 line of FIG. 7 is explained with reference to FIG. 8. As shown in FIG. 8, an insulating film 31 is formed on a semiconductor substrate 30. A p-type semiconductor layer 32 is formed on the insulating film 31 and an element isolation region STI is formed to such depth as to reach the insulating film 31. Portions of the semiconductor layer 32 which are surrounded by the element isolation region STI are used as the element regions AA3 to AA5. In the portion of the semiconductor layer 32 used as the element region AA3, a plurality of $n^+$-type impurity diffusion layers 33 are separately formed to reach the insulating film 31 from the surface of the semiconductor layer 32. The $n^+$-type impurity diffusion layers 33 function as the source (S) and drain (D) regions. The gate electrodes 20 are formed on portions of the semiconductor layer 32 which each lie between adjacent ones of the diffusion layers 33 with gate insulating films 34 disposed therebetween. With the above structure, the $n^+$-type impurity diffusion layers 33 and gate electrodes 20 are combined to configure MOS transistor units 37. That is, adjacent ones of the MOS transistor units 37 commonly use the source or drain. Regions of the semiconductor layer 32 in which the source and drain regions are not formed function as body regions of the MOS transistor units 37. The MOS transistor units 37 are combined and function as one large MOS transistor. In the portions of the semiconductor layer 32 which function as the element regions AA4, AA5, portions of the $n^+$-type impurity diffusion layers 33 which function as the sources (or drains) of the MOS transistor units 37 formed adjacent to the element regions AA4, AA5 are formed. Further, $p^+$-type impurity diffusion layers 23 are formed separately from the diffusion layers 33. In addition, the wiring layers 22 are formed on portions of the semiconductor layer 32 which lie between the diffusion layers 33 and 23 with insulating films 35 disposed therebetween. Contact plugs CP3 are formed on the diffusion layers 23.

Figure 9:
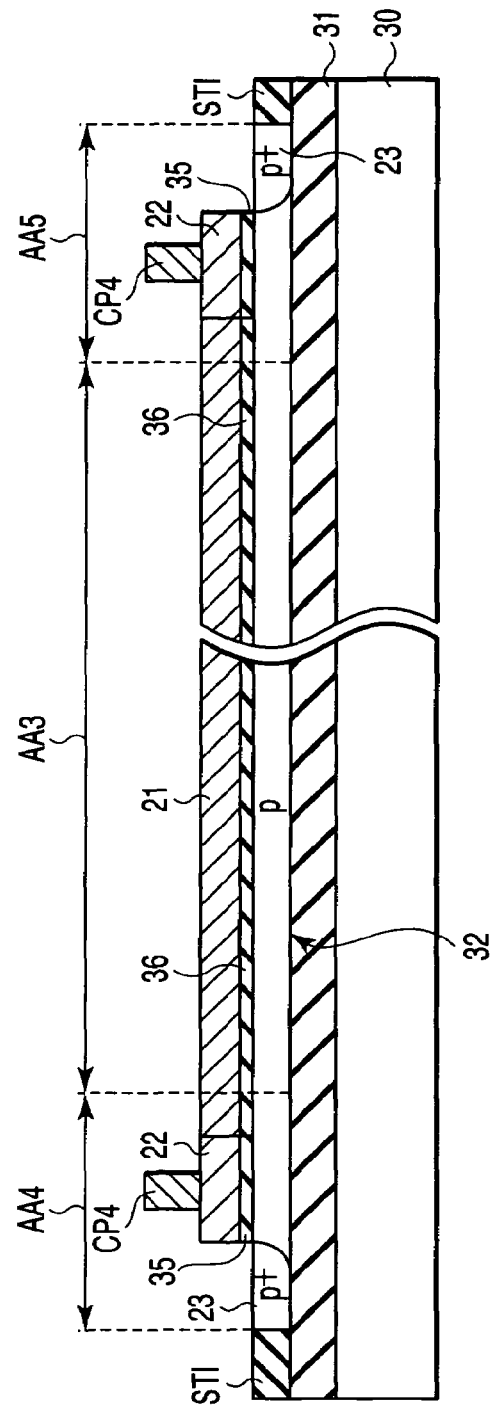
FIG. 9 is a cross sectional view taken along the 9-9 line of FIG. 7.

Next, the cross sectional structure taken along the 9-9 line of FIG. 7 is explained with reference to FIG. 9. As shown in FIG. 9, the $n^+$-type impurity diffusion layers 33 are not formed in the portions of the semiconductor layer 32 which are used as the element regions AA3 to AA5. The $p^+$-type impurity diffusion layers 23 are formed in the portions of the semiconductor layer 32 which function as the element regions AA4, AA5 and the wiring layers 22 are formed on the semiconductor layer 32 with the insulating films 35 disposed therebetween. The wiring layer 21 is formed on a portion of the semiconductor layer 32 which lies between the two wiring layers 22 with an insulating film 36 disposed therebetween. That is, the wiring layer 21 is formed to cover the entire surface of the semiconductor layer 32 in the element region AA3, formed in contact with the gate electrodes 20 and formed to reach the wiring layers 22. The contact plugs CP4 are formed on the wiring layers 22. The contact plugs CP4 are used to apply potential to the gate electrodes 20.

Figure 10:
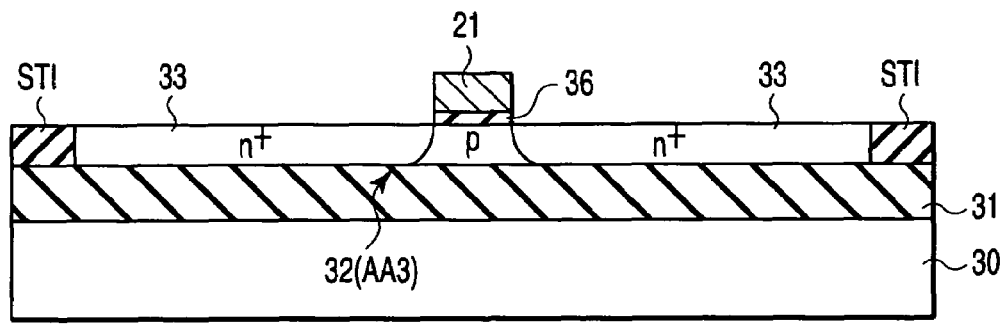
FIG. 10 is a cross sectional view taken along the 10-10 line of FIG. 7.

Next, the cross sectional structure taken along the 10-10 line of FIG. 7 is explained with reference to FIG. 10. As shown in FIG. 10, the insulating film 31 is formed on the semiconductor substrate 30. The semiconductor layer 32 (element region AA3) is formed on the insulating film 31 and the element isolation region STI is formed to surround the semiconductor layer 32 and formed to such depth as to reach the insulating film 31. In the semiconductor layer 32, the $n^+$-type impurity diffusion layers 33 which function as the drains (or sources) of the MOS transistor units 37 are separately formed. The diffusion layers 33 are formed to extend from the surface of the semiconductor layer 32 and reach the insulating film 31. The wiring layer 21 is formed on a portion of the semiconductor layer 32 which lies between the adjacent diffusion layers 33 with the insulating film 36 disposed therebetween.

Figure 11:
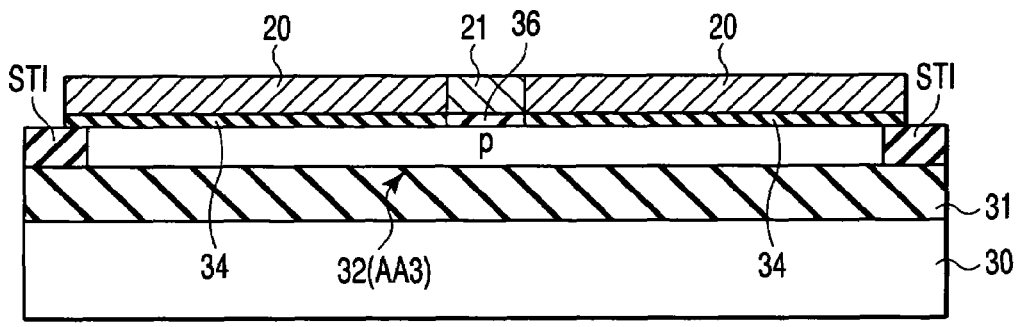
FIG. 11 is a cross sectional view taken along the 11-11 line of FIG. 7.

Next, the cross sectional structure taken along the 11-11 line of FIG. 7 is explained with reference to FIG. 11. As shown in FIG. 11, the n+-type impurity diffusion layers are not formed in the semiconductor layer 32. Further, like the case of FIG. 10, the wiring layer 21 is formed on the semiconductor layer 32 with the insulating film 36 disposed therebetween. Further, the gate electrodes 20 are formed to respectively extend from the wiring layer 21 to one end and the other end of the element region AA3 with the gate insulating film 34 disposed therebetween. That is, the entire portion of the element region AA3 taken along the 11-11 line is a p-type region and the upper entire surface of the p-type region is covered with the wiring layer 21 and gate electrodes 20.

Figure 12:
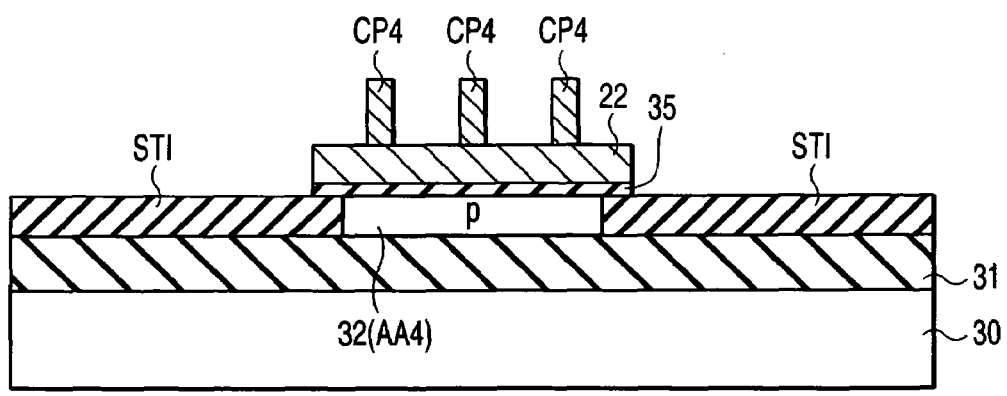
FIG. 12 is a cross sectional view taken along the 12-12 line of FIG. 7.

Next, the cross sectional structure taken along the 12-12 line of FIG. 7 is explained with reference to FIG. 12. As shown in FIG. 12, the insulating film 31 is formed on the semiconductor substrate 30. The semiconductor layer 32 is formed on the insulating film 31 and the element isolation region STI is formed to surround the semiconductor layer 32 and formed to such depth as to reach the insulating film 31. A portion of the semiconductor layer 32 which is surrounded by the element isolation region STI functions as the element region AA4. The n+-type impurity diffusion layers are not formed in the portion of the semiconductor layer 32 which functions as the element region AA4 and the portion is formed as a p-type region. Further, on the semiconductor layer 32, the wiring layer 22 is formed with the insulating film 35 disposed therebetween. The wiring layer 22 is formed to extend from one end of the element region AA4 to the other end thereof in the Y direction. That is, the upper entire surface of the semiconductor layer 32 in a region taken along the 12-12 line is covered with the wiring layer 22. Further, the contact plugs CP4 are formed on the wiring layer 22. The contact plugs CP4 are used to apply gate potential.

Figure 13:
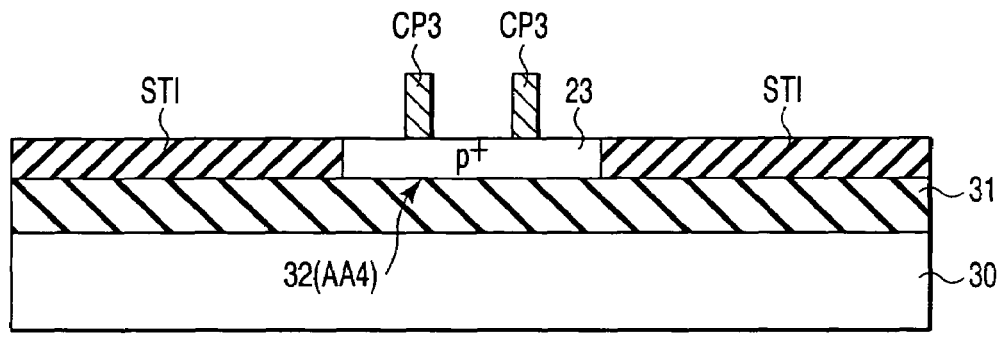
FIG. 13 is a cross sectional view taken along the 13-13 line of FIG. 7.

Next, the cross sectional structure taken along the 13-13 line of FIG. 7 is explained with reference to FIG. 13. As shown in FIG. 13, the p+-type impurity diffusion layers 23 are formed in the portion of the semiconductor layer 32 which functions as the element region AA4. Further, the contact plugs CP3 are formed on the diffusion layer 23. The contact plugs CP3 are used to apply potential to the body regions of the MOS transistor units 37.

Figure 14:
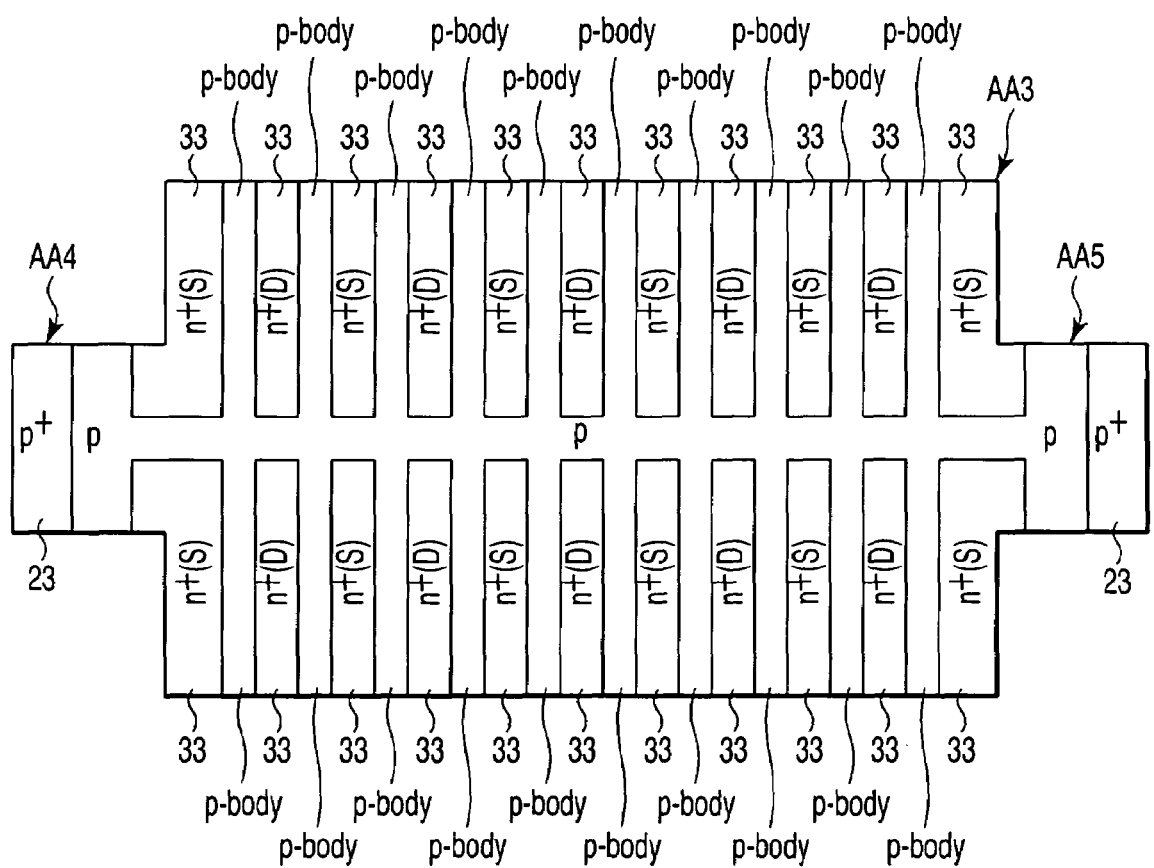
FIG. 14 is a plan view showing the CMOS circuit according to the second embodiment of this invention and showing the arrangement of p-type regions and n-type regions in an element region.

FIG. 14 is a plan view showing element regions AA3 to AA5 corresponding to those shown in FIG. 7 and shows the state of p-type and n-type regions. In FIG. 14, regions indicated by "p-body" are regions which function as body regions of the MOS transistor units 37. As shown in FIG. 14, regions of the element regions AA3 to AA5 which lie directly below the gate electrodes 20 and wiring layers 21, 22 are formed as p-type regions. Therefore, the body regions of the MOS transistor units 37 are electrically connected to the p+-type impurity diffusion layers 23 via the p-type region lying directly below the wiring layer 21 and the p-type regions lying directly below the wiring layers 22. As a result, it becomes possible to apply potential to the body regions of the MOS transistor units 37 via the contact plugs CP3.

With the configuration of the present embodiment, the following effect (2) can be attained in addition to the effect (1) explained in the first embodiment.

(2) The performance of the semiconductor device can be enhanced (#1).

With the configuration according to the present embodiment, the parasitic capacitance can be made smaller and the input capacitance of the CMOS circuit can be made smaller in comparison with the configuration explained in the first embodiment. Therefore, the analog characteristic (for example, cutoff frequency) of the analog CMOS circuit can be enhanced. This point is explained in detail below.

Figure 15:
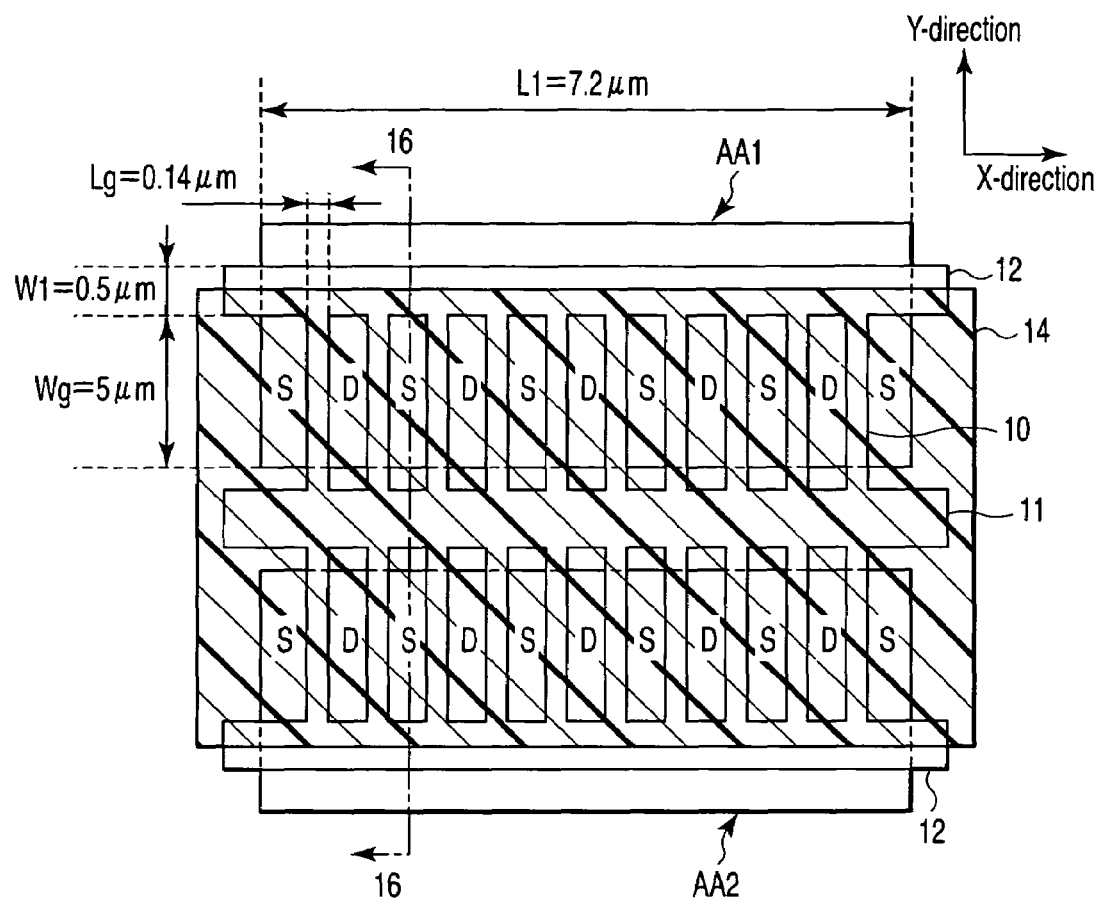
FIG. 15 is a plan view showing the CMOS circuit according to the first embodiment of this invention and showing the state at the time of the ion-implantation process.
Figure 16:
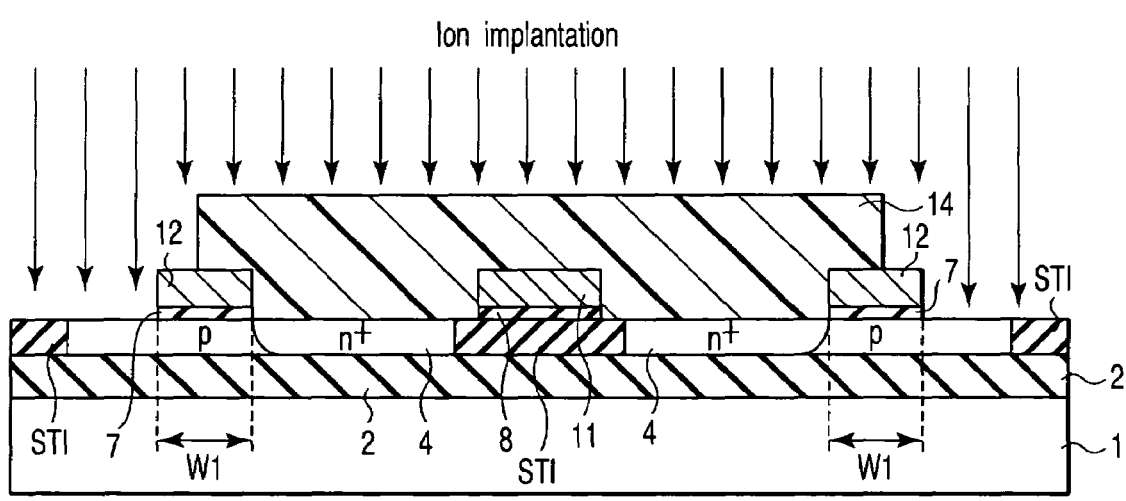
FIG. 16 is a cross sectional view taken along the 16-16 line of FIG. 15.

The p+-type impurity diffusion layers 13 in the structure according to the first embodiment are formed by ion-implanting p-type impurity into the semiconductor layer 3 and activate the p-type impurity by the heat treatment. Therefore, at the time of ion-implantation, a mask member is required to be formed on regions other than the layer-forming regions of the p+-type impurity diffusion layers 13 so as to prevent p-type impurity from being doped into the above regions. This state is shown in FIGS. 15 and 16. FIG. 15 is a plan view showing the CMOS circuit according to the first embodiment at the time of formation of the p+-type impurity diffusion layers 13 and corresponds to FIG. 1. FIG. 16 is a cross sectional view taken along the 16-16 line of FIG. 15.

The mask member 14 shown in FIGS. 15 and 16 is formed to completely cover the source and drain regions of the MOS transistor units 6 and expose the layer-forming portions of the diffusion layers 13. As is explained in the first embodiment, the wiring layers 12 are formed between the source and drain regions and the layer-forming regions of the diffusion layers 13 in order to prevent occurrence of a short circuit of the silicide films. Therefore, the mask member 14 is so formed that the end portions thereof respectively lie on the wiring layers 12. As a result, it becomes necessary to provide a process margin for the wiring width of the wiring layer 12 so that the end portions of the mask member 14 will lie on the wiring layers 12 even when misalignment occurs in the photolithography process used at the time of formation of the mask member 14. For example, if the minimum processing size (design rule) is 0.14 μm, the wiring width (gate length) Lg of the gate 10 can be designed with 0.14 μm, but it is necessary to set the wiring width W1 of the wiring layer 12 to 0.5 μm or more.

The wiring layer 12 is formed on the semiconductor layer 3 with the insulating film 7 disposed therebetween. That is, the parasitic capacitance is formed by the semiconductor layer 3, insulating film 7 and wiring layer 12. The parasitic capacitance becomes larger in proportion to an increase in the area of the surface of the wiring layer 12 which faces the semiconductor layer 3. Therefore, the parasitic capacitance becomes larger as the wiring width W1 becomes larger. The presence of the parasitic capacitance causes deterioration in the analog characteristic of the CMOS circuit. For example, if the length L1 of the element regions AA1, AA2 in the X direction in the structure shown in FIG. 15 is 7.2 μm and the gate width Wg is 5 μm, the cutoff frequency is lowered from 80 GHz to 61 GHz.

Figure 17:
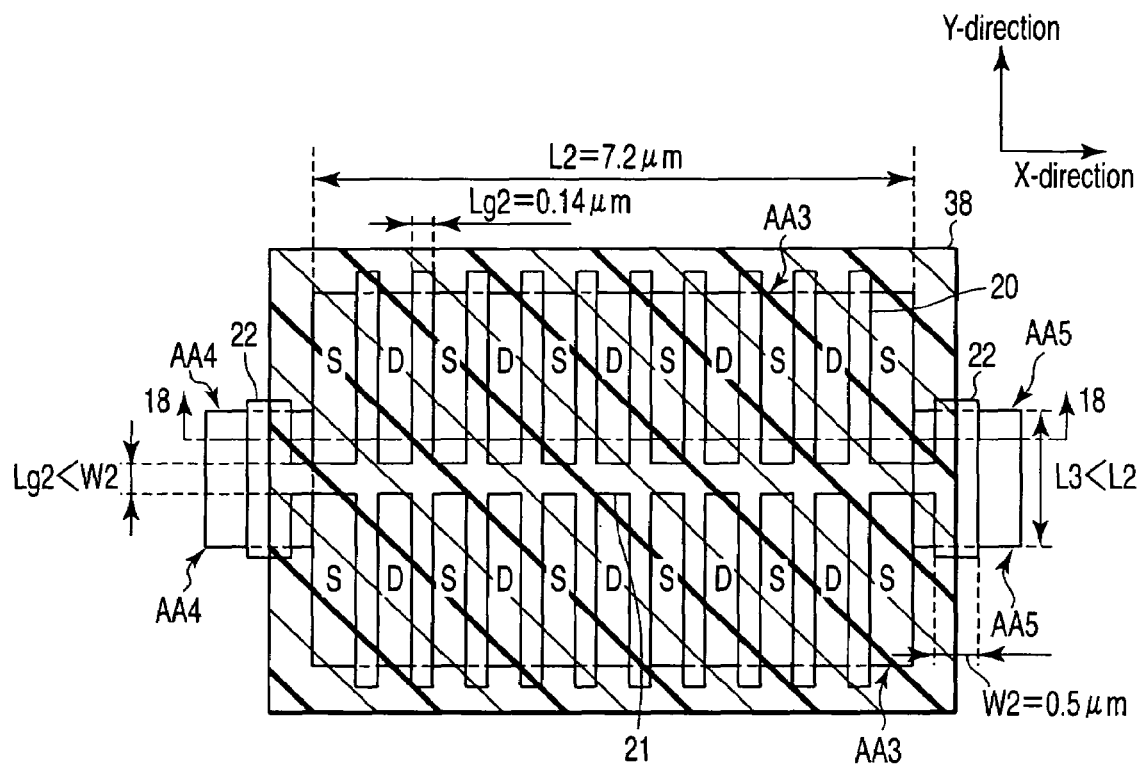
FIG. 17 is a plan view showing the CMOS circuit according to the second embodiment of this invention and showing the state at the time of the ion-implantation process.
Figure 18:
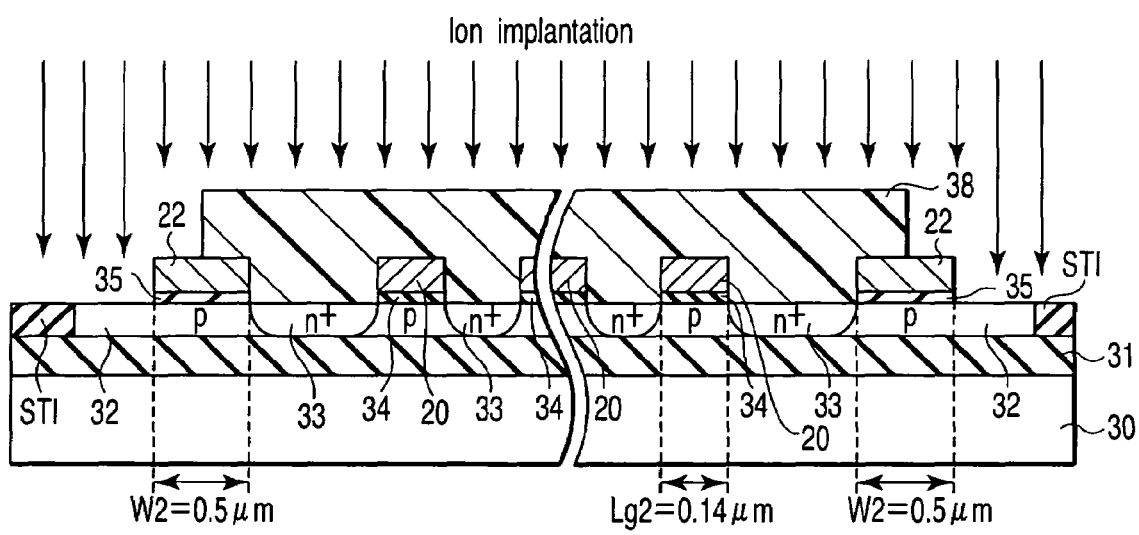
FIG. 18 is a cross sectional view taken along the 18-18 line of FIG. 17.

However, in the structure of the present embodiment, the above parasitic capacitance can be markedly lowered. Also, in the present embodiment, the p+-type impurity diffusion layers 23 are formed by ion-implantation of p-type impurity into the semiconductor layer 32. Therefore, at the time of ion-implantation, a mask member is formed on portions other than the layer-forming regions of the p+-type impurity diffusion layers 23. The state at this time is shown in FIGS. 17 and 18. FIG. 17 is a plan view showing the CMOS circuit according to the present embodiment at the time of formation of the p+-type impurity diffusion layers 23 and corresponds to FIG. 7. FIG. 18 is a cross sectional view taken along the 18-18 line of FIG. 17.

As shown in FIGS. 17 and 18, a mask member 38 is formed to completely cover the source and drain regions of MOS transistor units 37 and expose the layer-forming portions of the diffusion layers 23. As is explained in the first embodiment, wiring layers 22 are formed between the source and drain regions and the layer-forming regions of the diffusion layers 23 in order to prevent occurrence of a short circuit of the silicide films. Therefore, the mask member 38 is so formed that the end portions thereof respectively lie on the wiring layers 22. Thus, it becomes necessary to design the wiring width W2 of the wiring layer 22 by taking misalignment occurring in the photolithography process into consideration and it is set to 0.5 μm which is the same as that of the wiring layer 12 of the first embodiment, for example. However, unlike the wiring layer 12 of the first embodiment, the wiring layer 22 in the present embodiment is not required to commonly connect the gate electrodes and is only required to cross the element regions AA4, AA5 in the Y direction. Therefore, if the length of the element region AA3 in the X direction is L2 and the length of the element regions AA4, AA5 in the Y direction is L3, the relation of L3<L2 (=L1) can be attained. As a result, the area of the wiring layer 22 which overlaps with the element region AA4, AA5 is smaller than the area of the wiring layer 12 which overlaps with the element region AA1, AA2 in the first embodiment. That is, according to the present embodiment, the parasitic capacitance caused by the wiring layer 22 can be made markedly smaller than the parasitic capacitance caused by the wiring layer 12 in the first embodiment.

Further, with the structure according to the present embodiment, the wiring layer 21 is formed to commonly connect a plurality of gate electrodes 20 instead of the wiring layer 12 in the first embodiment. The wiring layer 21 is formed on the element region AA3. However, the wiring layer 21 can be formed by use of the minimum processing size (=gate length Lg2) since it is unnecessary to take the margin into consideration. Therefore, the parasitic capacitance caused by the wiring layer 21 can be made as small as negligible.

Thus, according to the present embodiment, the input capacitance of the CMOS circuit can be markedly reduced and the deterioration in the analog characteristic of the CMOS circuit can be suppressed in comparison with those of the first embodiment. For example, when the relation of L2 (=L1)=7.2 μm, Lg2 (=Lg1)=0.14 μm and W2 (=W1)=0.5 μm is set, the cutoff frequency is set to 70 GHz.

Figure 19:
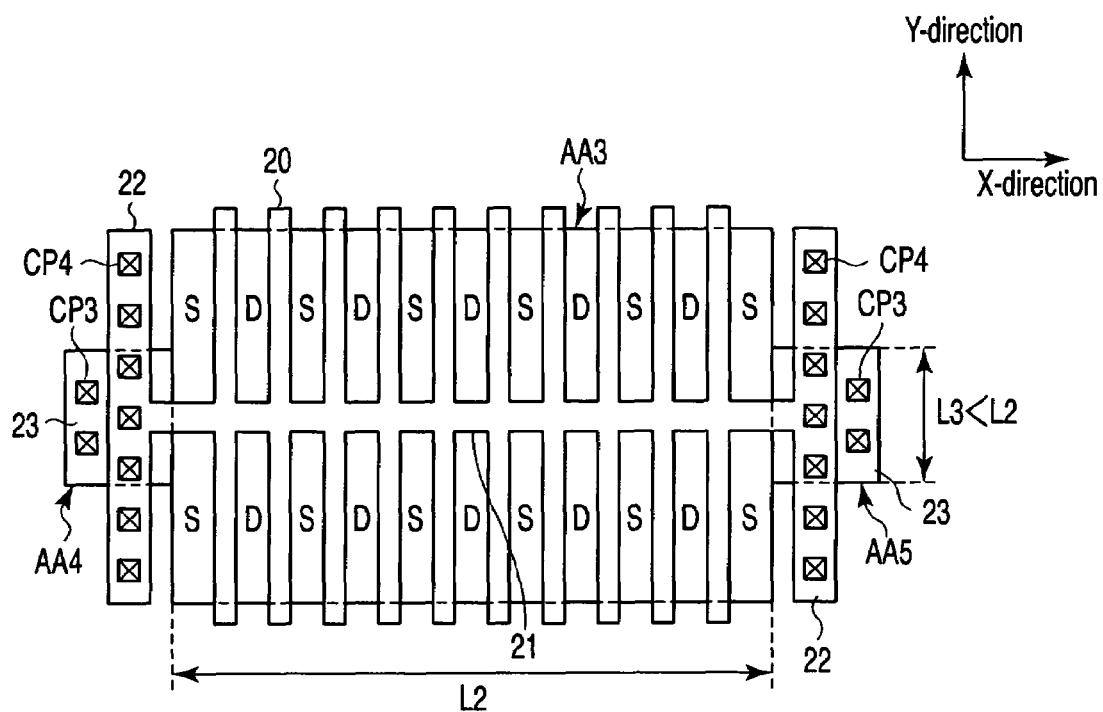
FIG. 19 is a plan view of a CMOS circuit according to a first modification of the second embodiment of this invention.

The wiring layer 22 in the present embodiment can be formed to extend in the Y direction as shown in FIG. 19. FIG. 19 is a plan view of a CMOS circuit according to a first modification of the present embodiment. As shown in FIG. 19, the length of the wiring layer 22 in the Y direction is set larger than that in the case of FIG. 7. With the present structure, since the number of contact plugs CP4 can be made larger than that in the case of FIG. 7, the input resistance of the CMOS circuit can be reduced. Further, since the area of the wiring layer 22 which overlaps with the element region AA4, AA5 is the same as that in the case of FIG. 7, the parasitic capacitance is also equal to that in the case of FIG. 7.

Figure 20:
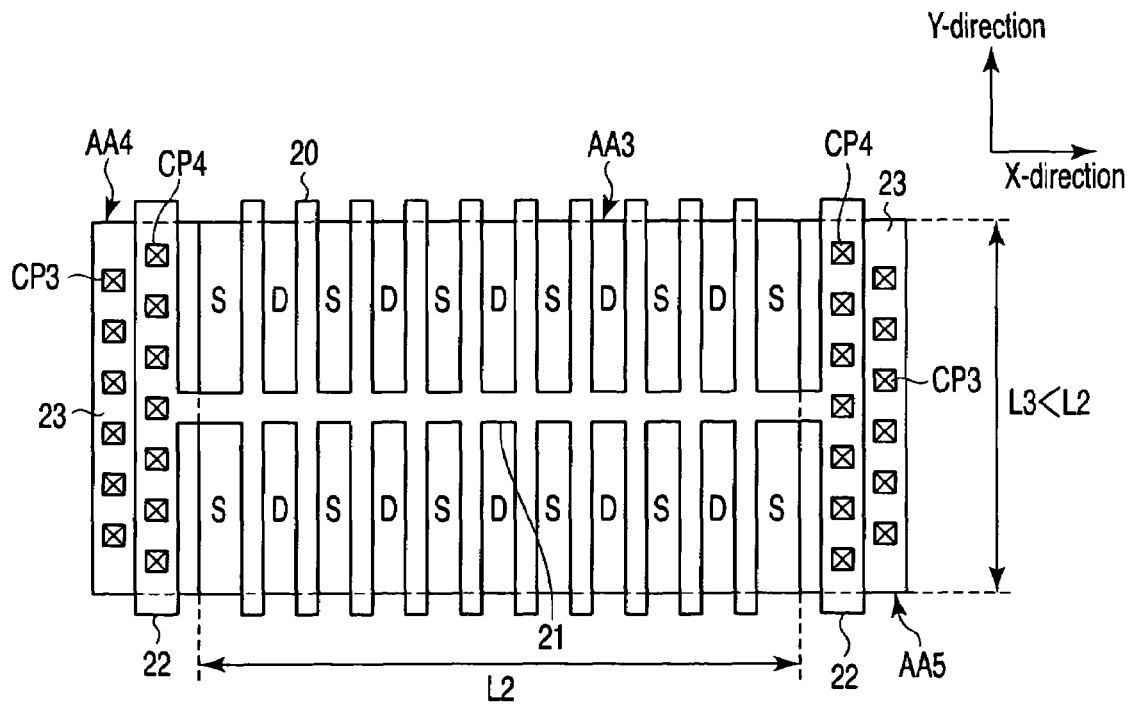
FIG. 20 is a plan view of a CMOS circuit according to a second modification of the second embodiment of this invention.

The length of the element region AA4, AA5 in the Y direction can be set equal to or larger than that of the element region AA3 in the Y direction as shown in FIG. 20. FIG. 20 is a plan view of a CMOS circuit according to a second modification of the present embodiment. With the structure shown in FIG. 20, since the number of contact plugs CP3 can be increased, the operation reliability of the CMOS circuit can be enhanced. With the structure of FIG. 20, the parasitic capacitance is made larger in comparison with that of the structure shown in FIG. 7 or 19. However, if the area of the wiring layer 22 which overlaps with the element region AA4, AA5 is smaller than the area of the wiring layer 12 of FIG. 1 which overlaps with the element region AA1, AA2, the parasitic capacitance becomes smaller than that of the first embodiment and the effect (2) can be attained.

Figure 21:
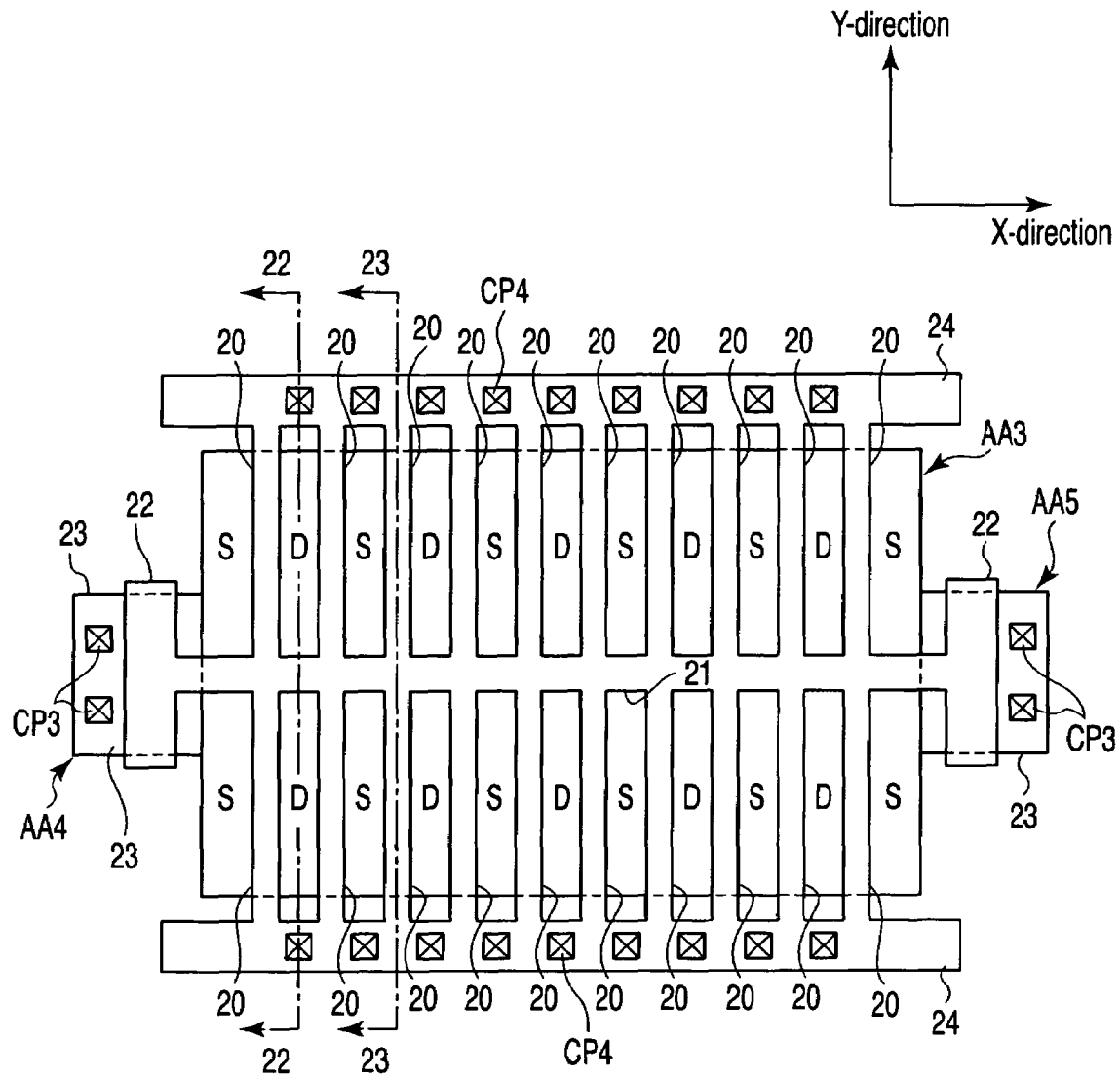
FIG. 21 is a plan view of a CMOS circuit according to a third embodiment of this invention.

Next, a semiconductor device according to a third embodiment of this invention is explained. The present embodiment is attained by forming gate contacts on wiring layers formed on the element isolation region in the second embodiment. FIG. 21 is a plan view of an analog CMOS circuit according to the present embodiment and FIGS. 22 and 23 are cross sectional views taken along the 22-22 line and 23-23 line of FIG. 21.

Figure 22:
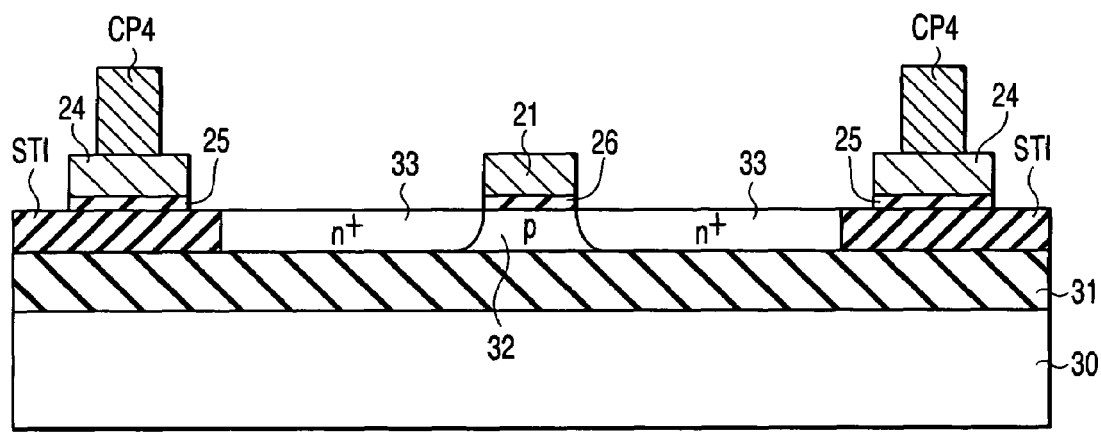
FIG. 22 is a cross sectional view taken along the 22-22 line of FIG. 21.
Figure 23:
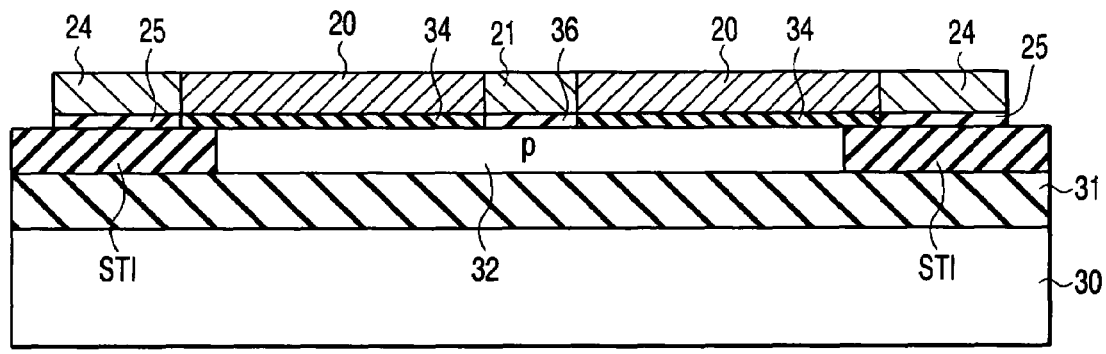
FIG. 23 is a cross sectional view taken along the 23-23 line of FIG. 21.

As shown in FIGS. 21 to 23, the CMOS circuit according to the present embodiment has wiring layers 24 in the structure of the second embodiment. The wiring layers 24 each have a stripe form extending in the X direction and commonly connected to one-side ends of gate electrodes 20 in the lengthwise direction. That is, a plurality of gate electrodes 20 are commonly connected at one-side ends to the wiring layer 24 and commonly connected at the other ends to a wiring layer 21. Contact plugs CP4 used to apply potential to the gate electrodes 20 are formed not on the wiring layers 22 but on the wiring layers 24. The other configuration is the same as that of the second embodiment.

With the structure according to the present embodiment, the following effect (3) can be attained in addition to the effects (1), (2) explained in the first, second embodiments.

(3) The performance of the semiconductor device can be enhanced (#2).

With the configuration according to the present embodiment, the wiring layers 24 are formed as regions on which the contact plugs CP4 are formed. Therefore, the number of contact plugs CP4 can be increased. As a result, a gate signal can be rapidly transmitted to the gates 20 of the MOS transistor units 37 and the operation speed and operation reliability of the MOS transistor units 37 can be enhanced.

Figure 24:
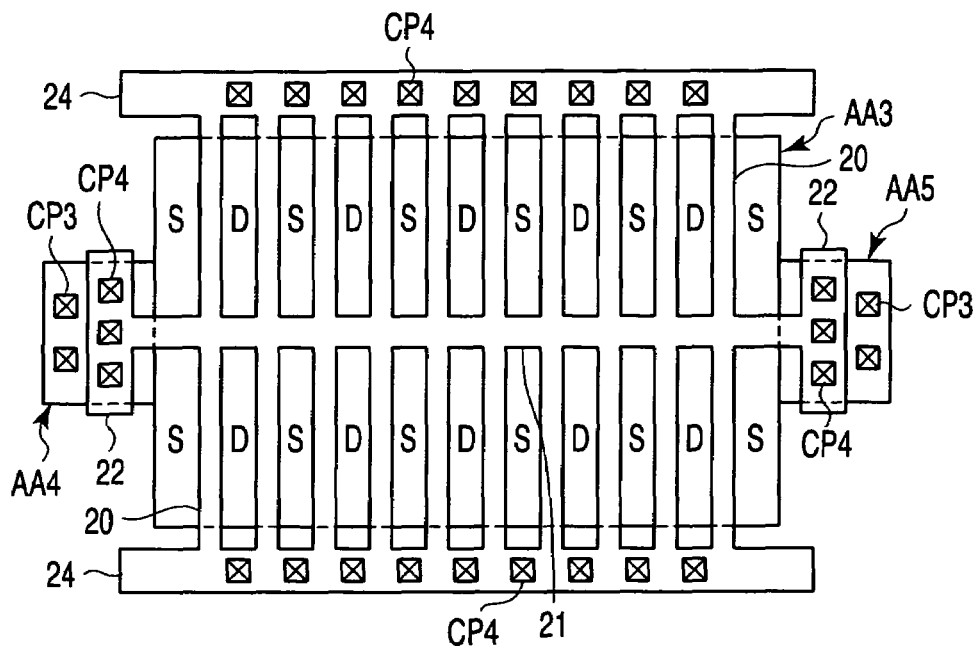
FIG. 24 is a plan view of a CMOS circuit according to a first modification of the third embodiment of this invention.

As shown in FIG. 24, the structure of the present embodiment and the structure of FIG. 7 explained in the second embodiment can be combined. FIG. 24 is a plan view of a CMOS circuit according to a first modification of the present embodiment. As shown in FIG. 24, contact plugs CP4 can be additionally formed on the wiring layers 22 in the structure shown in FIG. 21. Of course, it is possible to further extend the wiring layer 22 in the Y direction in FIG. 24.

Figure 25:
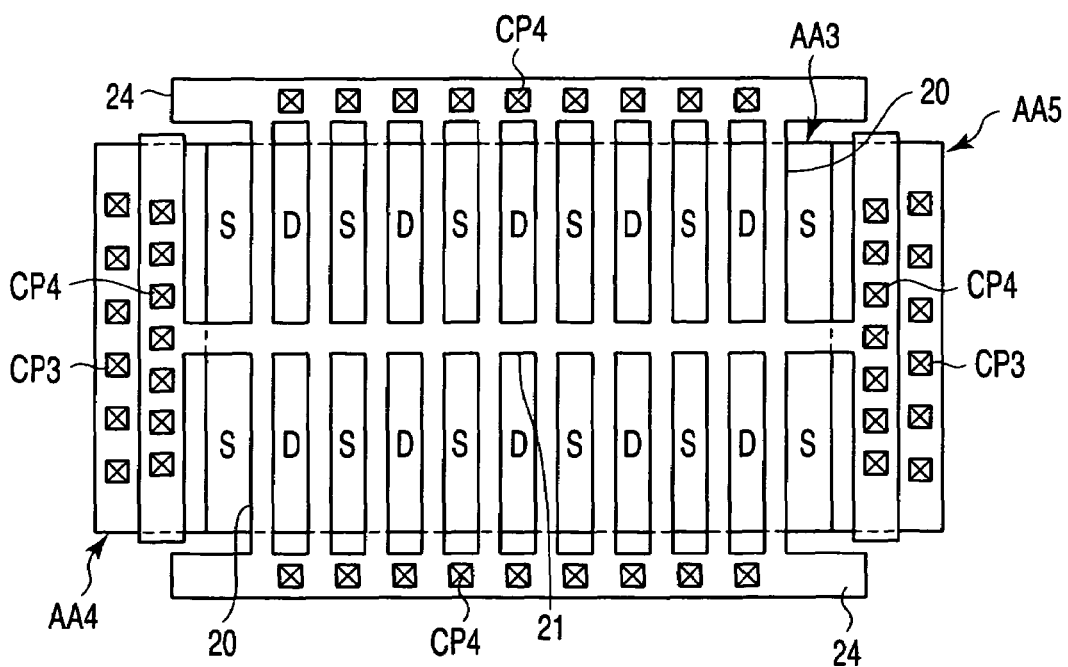
FIG. 25 is a plan view of a CMOS circuit according to a second modification of the third embodiment of this invention.

As shown in FIG. 25, the structure according to the present embodiment can be applied to the structure shown in FIG. 20. FIG. 25 is a plan view of a CMOS circuit according to a second modification of the present embodiment. As shown in FIG. 25, wiring layers 24 can be additionally formed in the structure shown in FIG. 20.

Figure 26:
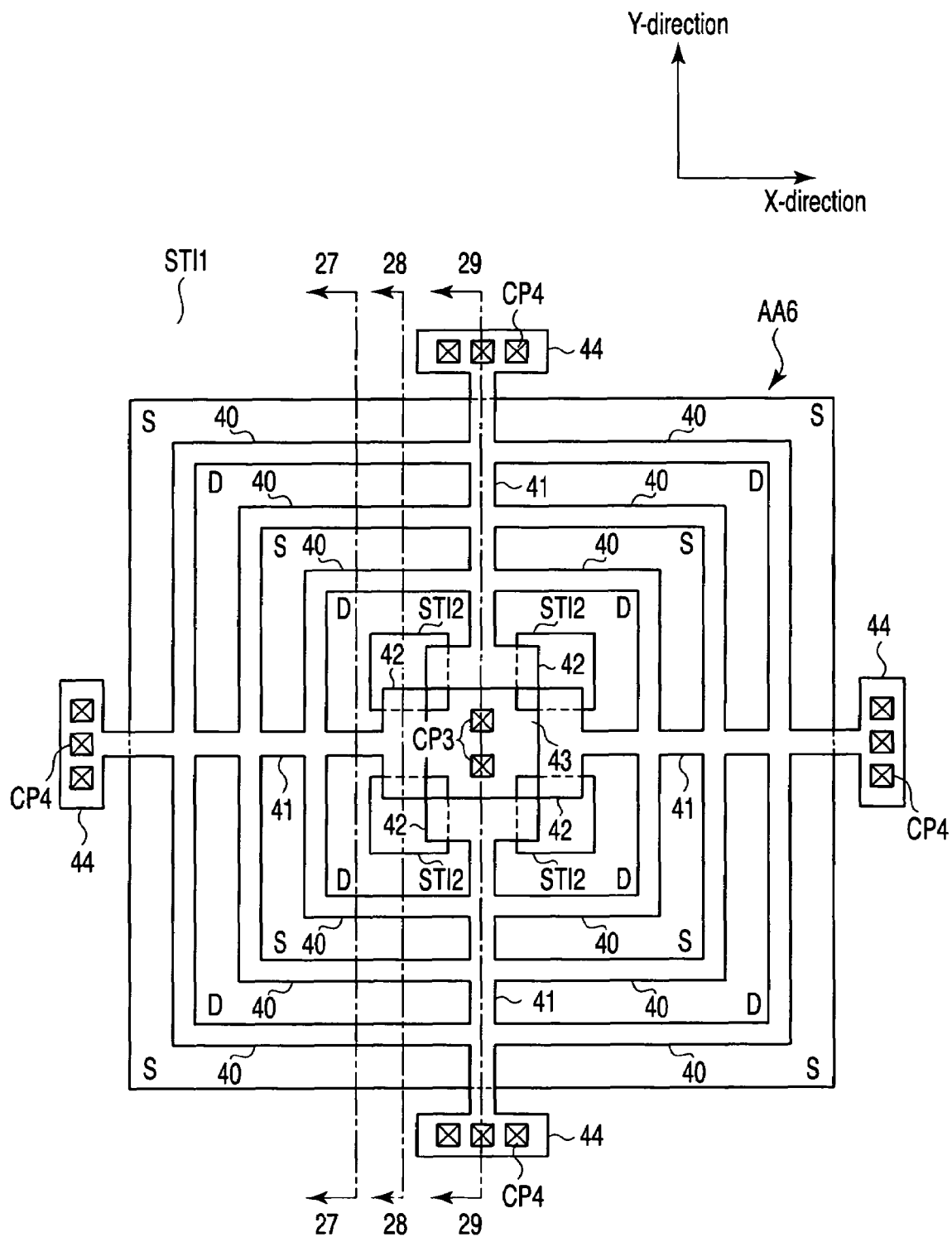
FIG. 26 is a plan view of a CMOS circuit according to a fourth embodiment of this invention.

Next, a semiconductor device according to a fourth embodiment of this invention is explained. The present embodiment can be attained by applying the structure explained in the first to third embodiments to a structure that comprises a gate electrode shaped like a closed loop, a drain and source provided inside and outside the gate. FIG. 26 is a plan view of an analog CMOS circuit according to the present embodiment.

As shown in FIG. 26, the CMOS circuit is formed on a square element region AA6 surrounded by an element isolation region STI1. The element region AA6 is a p-type semiconductor layer formed on an insulating film which is formed on a semiconductor substrate. A plurality of gate electrodes 40 each being shaped like a square window frame are formed on the element region AA6 with gate insulating films disposed therebetween with the centers of the squares set at the same position, that is, in a nested structure. Further, wiring layers 41 which commonly connect a plurality of gate electrodes are formed to radially extend from the central portion of the square toward the exterior. One-side end portions of the wiring layers 41 are lead out to the exterior of the element region AA6 and connected to wiring layers 44 formed on the element isolation region STI1. The other ends of the wiring layers 41 are positioned at the central portion of the element region AA6 and connected to wiring layers 42 formed on the element region AA6.

In regions which lie on both sides of each gate electrode 40 in the element region AA, $n^+$-type impurity diffusion layers are formed. The $n^+$-type impurity diffusion layers function as source and drain regions of MOS transistors. In FIG. 26, regions indicated by "S" are regions in which the $n^+$-type impurity diffusion layers functioning as the source regions are formed and regions indicated by "D" are regions in which the $n^+$-type impurity diffusion layer functioning as the drain regions are formed. The $n^+$-type impurity diffusion layer is not formed in regions which lie directly below the gate electrodes 40 and wiring layers 41, 42 and the regions function as p-type well regions. Further, a $p^+$-type impurity diffusion layer 43 is formed in a region surrounded by the wiring layers 42. Therefore, the diffusion layer 43 is electrically connected to the p-type well regions. Further, in the element region AA6, a plurality of element isolation regions STI2 are separately formed inside the innermost one of the gate electrodes 40. Each of the wiring layers 42 is formed in a region between the adjacent element isolation regions STI2 and formed to extend from one of the element isolation regions STI2 to the other element isolation region STI2. A plurality of contact plugs CP3 are formed on the $p^+$-type impurity diffusion layer 43. The contact plugs CP3 are used to apply potential to the p-type well regions. Further, a plurality of contact plugs CP4 are formed on the wiring layers 44. The contact plugs CP4 are used to apply potential to the gate electrodes 40.

Figure 27:
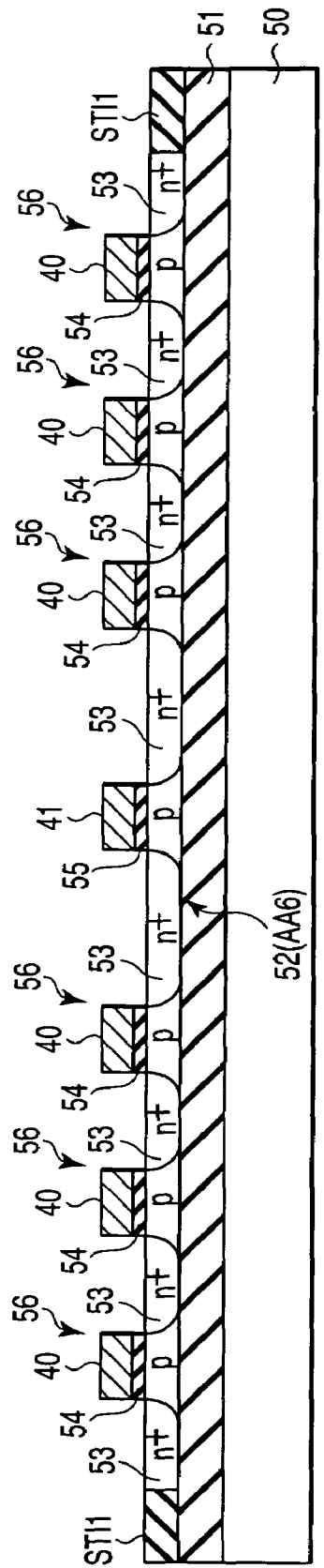
FIG. 27 is a cross sectional view taken along the 27-27 line of FIG. 26.
Figure 28:
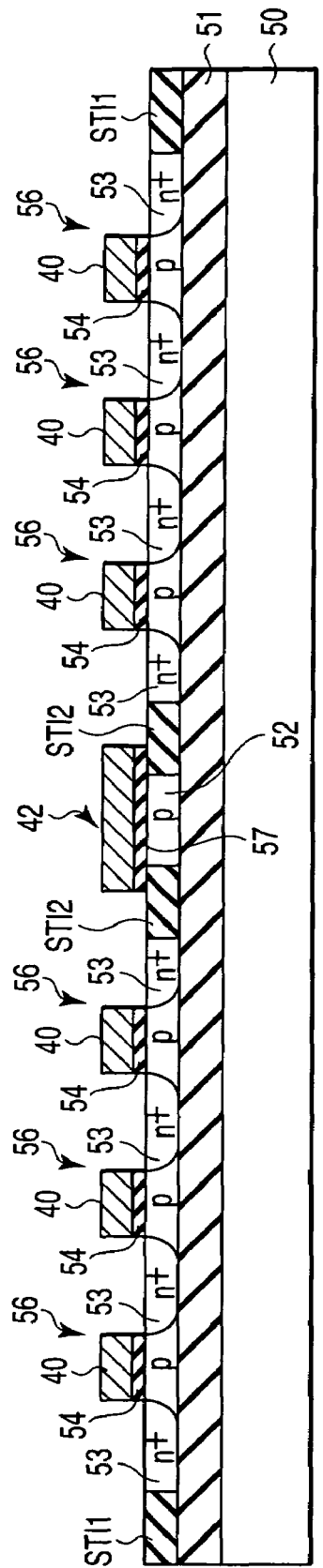
FIG. 28 is a cross sectional view taken along the 28-28 line of FIG. 26.
Figure 29:
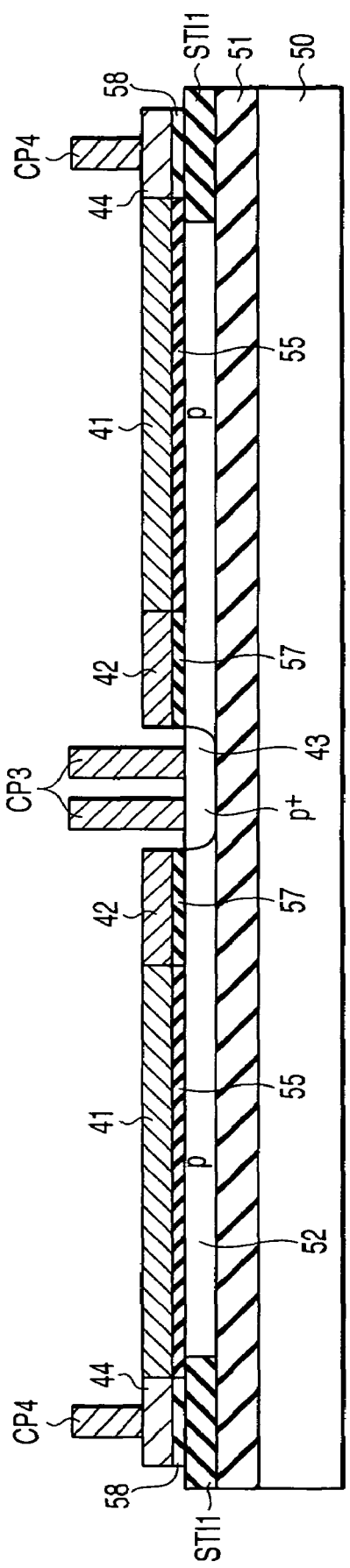
FIG. 29 is a cross sectional view taken along the 29-29 line of FIG. 26.

Next, the cross sectional structure of the analog CMOS circuit with the above structure is explained with reference to FIGS. 27 to 29. FIGS. 27 to 29 are cross sectional views taken along the 27-27 line, 28-28 line and 29-29 line of FIG. 26.

First, the cross sectional structure taken along the 27-27 line of FIG. 26 is explained with reference to FIG. 27. As shown in FIG. 27, an insulating film 51 is formed on a semiconductor substrate 50. For example, the insulating film 51 is formed by use of a silicon oxide film or the like. A p-type semiconductor layer 52 is formed on the insulating film 51 and the element isolation region STI1 is formed to surround the semiconductor layer 52 and formed to such depth as to reach the insulating film 51. The semiconductor layer 52 surrounded by the element isolation region STI1 is used as the element region AA6. In the semiconductor layer 52, a plurality of $n^+$-type impurity diffusion layers 53 are separately formed to extend from the surface of the semiconductor layer 52 to the insulating film 51. The $n^+$-type impurity diffusion layers 53 function as the source (S) and drain (D) regions. On a portion of the semiconductor layer 52 which lies between the adjacent diffusion layers 53, the gate electrodes 40 are formed with gate insulating films 54 disposed therebetween. With the above structure, the $n^+$-type impurity diffusion layers 53 and gate electrodes 40 are combined to configure MOS transistor units 56. Therefore, adjacent ones of the MOS transistor units 56 commonly use the source or drain region. A region of the semiconductor layer 52 in which the source and drain regions are not formed functions as a body region of the MOS transistor unit 56. The MOS transistor units 56 are combined and function as one large MOS transistor. Further, in the central portion of the element region AA6, the wiring layer 41 is formed on a portion of the semiconductor layer 52 which lies between the adjacent diffusion layers 53 with an insulating film 55 disposed therebetween.

Next, the cross sectional structure taken along the 28-28 line is explained with reference to FIG. 28. As shown in FIG. 28, the cross sectional structure taken along the 28-28 line is obtained by forming the element isolation regions STI2 between the p-type semiconductor layer 52 which lies in the central portion of the element region AA6 and the drain region 53 adjacent thereto in the structure shown in FIG. 27. The element isolation region STI2 is formed to reach the insulating film 51. Further, the wiring layer 42 is formed instead of the wiring layer 41. The wiring layer 42 is formed on a portion of the semiconductor layer 52 which lies between the element isolation regions STI2 with an insulating film 57 disposed therebetween.

Next, the cross sectional structure taken along the 29-29 line is explained with reference to FIG. 29. As shown in FIG. 29, $n^+$-type impurity diffusion layers are not formed in the semiconductor layer 52 formed on the insulating film 51. Further, the $p^+$-type impurity diffusion layer 43 is formed in the central portion of the semiconductor layer 52. Therefore, the entire portion of the element region AA6 taken along the 29-29 line is used as a p-type region. The wiring layers 44 are formed on the element isolation regions STI1 formed on the insulating film 51 to surround the element region AA6 with insulating films 58 disposed therebetween. On the semiconductor layer 52, the wiring layers 42 are formed to surround the $p^+$-type impurity diffusion layer 43 with the insulating layers 57 disposed therebetween. Further, the wiring layers 41 are formed on the semiconductor layer 52 with insulating layers 55 disposed therebetween to connect the wiring layers 42 to the wiring layers 44. The contact plugs CP3 are formed on the diffusion layer 43 and the contact plugs CP4 are formed on the wiring layers 44.

Figure 30:
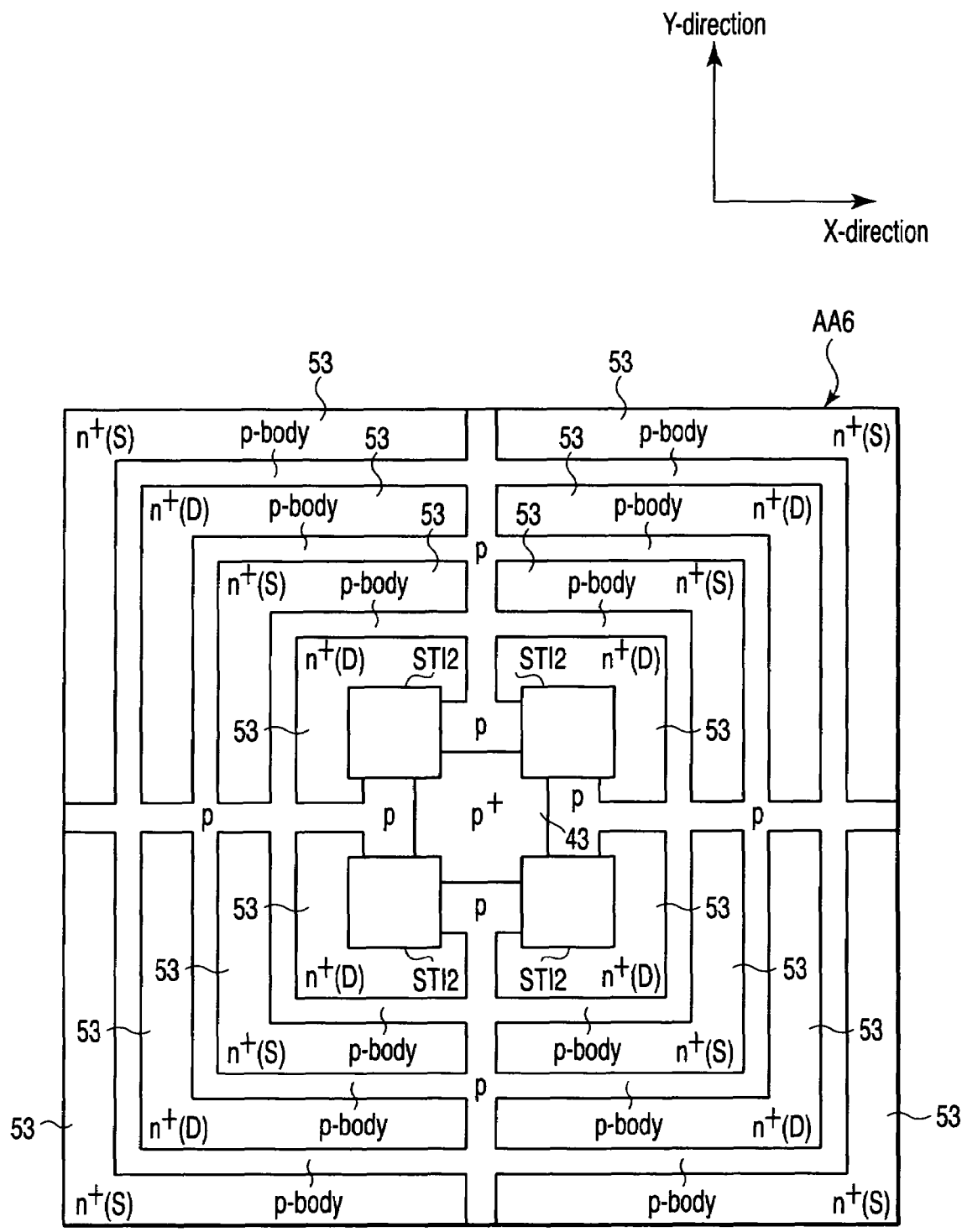
FIG. 30 is a plan view showing the CMOS circuit according to the fourth embodiment of this invention and showing the arrangement of p-type regions and n-type regions in an element region.

FIG. 30 is a plan view of an element region AA6 corresponding to that of FIG. 26 and shows the state of p-type regions and n-type regions. In FIG. 30, regions indicated by "p-body" are regions each functioning as the body region of the MOS transistor unit 56. As shown in FIG. 30, regions lying directly below the gate electrodes 40 and wiring layers 41, 42 in the element region AA6 are used as p-type regions. The $p^+$-type impurity diffusion layer 43 is formed in the central portion of the element region AA6, that is, in a region surrounded by regions lying directly below the wiring layers 42 and element isolation regions STI2. Therefore, the body regions of the MOS transistor units 56 are connected to the diffusion layer 43 via p-type regions lying directly below the wiring layers 41, 42. Thus, it is possible to apply potential to the body regions of the MOS transistor units 56 via the contact plugs CP3.

With the above structure, the effects (1) to (3) explained in the first to third embodiments can be attained even when the structure that comprises a gate electrode shaped like a closed loop, a drain and source provided inside and outside the gate is used. The effects are explained in detail below.

First, the effect (1) is explained. With the structure of the present embodiment, as is explained with reference to FIG. 30, potential can be applied to the body regions of the MOS transistor units 56 via the $p^+$-type impurity diffusion layer 43. Therefore, it is possible to prevent the body region of the MOS transistor unit 56 from being set into the electrically floating state and suppress occurrence of the floating body effect. Further, in the present embodiment, as shown in FIGS. 26 and 30, the wiring layers 42 are formed to separate the source and drain regions of the MOS transistor units 56 from the $p^+$-type impurity diffusion layer 43. Therefore, in the manufacturing process, the silicide films on the source and drain regions are separated from the silicide film on the $p^+$-type impurity diffusion layer 43 by the presence of the wiring layers 42 and the silicide films can be prevented from being short-circuited.

Next, the effect (2) is explained. In the present embodiment, the p+-type impurity diffusion layer 43 is formed by ion-implanting p-type impurity into the semiconductor layer 52 and performing the heat treatment. At the time of ion-implantation, a mask member is formed on a portion other than the layer-forming region of the p+-type impurity diffusion layer 43. The state is shown in FIG. 31. FIG. 31 is a plan view showing the CMOS circuit according to the present embodiment at the time of formation of the p+-type impurity diffusion layer 43.

As shown in FIG. 31, a mask member 59 is formed to completely cover the source and drain regions of the MOS transistor units 56 and expose the layer-forming portion of the diffusion layer 43. As described above, in order to prevent the short circuit of the silicide films, the wiring layers 42 are formed between the layer-forming region of the diffusion layer 43 and the source and drain regions. Therefore, the mask member 59 is required to be so formed that the end portions thereof will be set on the wiring layers 42. For this purpose, it is necessary to design the wiring width of the wiring layer 42 by taking misalignment in the photolithography process into consideration and the wiring width is set to 0.5 μm like the case of the wiring layer 12 of the first embodiment, for example. However, the wiring layer 42 is arranged in a region surrounded by the MOS transistor units 56, that is, in the central portion of the element region AA6. Therefore, the area of the semiconductor layer 52 which overlaps with the wiring layers 42 can be made small. Thus, the parasitic capacitance caused by the wiring layers 42 becomes extremely small.

Further, with the structure according to the present embodiment, the wiring layer 41 is formed to commonly connect a plurality of gate electrodes 40. The wiring layer 41 is formed on the semiconductor layer 52. However, since the wiring layer 42 can be designed with the minimum processing size, the parasitic capacitance caused by the wiring layer 42 can be made as small as negligible. Thus, the input capacitance of the CMOS circuit can be made small and deterioration in the analog characteristic of the CMOS circuit can be suppressed. For example, the cutoff frequency is set to 78 GHz.

Further, since a plurality of contact plugs CP4 can be formed by forming the wiring layers 44, the input resistance of the gate can be reduced and the effect (3) can be attained.

In the above embodiment, a case wherein the shape of the window frame-shaped gate electrode 40 is a square is explained as an example, but a gate electrode of any shape can be used if it is polygonal. For example, a triangle, pentagon or another polygon can be used. However, it is preferable that the shape of the gate electrode 40 has a large number of corner portions. This is because the gate width in the corner portion tends to become larger as the angle becomes smaller in the patterning process by using the photolithography technique. That is, the gate width becomes more uniform as the angle becomes larger and the performance of the MOS transistor is enhanced. More preferably, it is desirable to use a polygon having a larger number of corner portions than a square in which the angle is not set to an acute angle. Further, the gate electrode 40 can be formed in a circular form or elliptical form. FIG. 32 is a plan view of a CMOS circuit according to a first modification of the present embodiment. As shown in FIG. 32, when the gate electrodes 40 are formed in a concentric circular form, the gate widths of the gate electrodes 40 can be made substantially uniform in the entire portion.

Further, as shown in FIG. 33, diffusion layers 43 may be formed outside the element region AA6 in the above embodiment. FIG. 33 is a plan view of a CMOS circuit according to a second modification of the present embodiment. As shown in FIG. 33, element regions AA7 are additionally formed around the element region AA6. Further, the p+-type impurity diffusion layers 43 are formed in portions of the semiconductor layer 52 which function as the element regions AA7. In addition, wiring layers 44 are formed on the element regions AA7 and the diffusion layers 43 are separated from the source and drain regions of the MOS transistor units 56 by the presence of the wiring layers 44. A region of the element region AA7 lying directly below the wiring layer 44 is used as a p-type region. Therefore, the diffusion layer 43 in each of the element regions AA7 is electrically connected to the body region of the MOS transistor unit 56 via the regions lying directly below the wiring layers 44, 41. Contact plugs CP3 are formed on the diffusion layers 43 in the element regions AA7. With the above structure, the number of contact plugs CP3 can be increased. Further, as shown in FIG. 33, contact plugs CP4 can be formed on the wiring layers 42. The direction and the number of wiring layers 41 are not limited to those shown in the drawing in the present embodiment.

Figure 34:
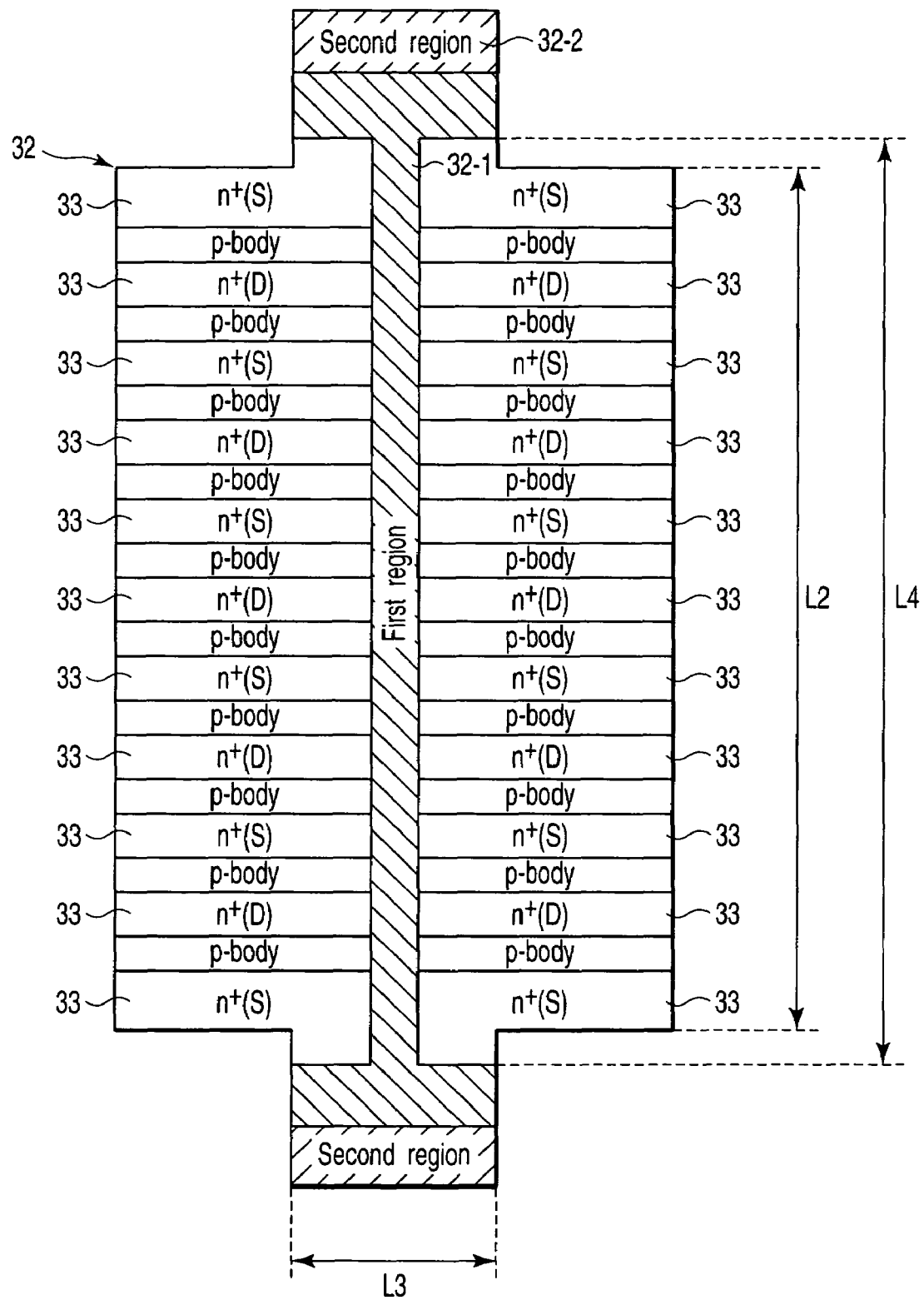
FIG. 34 is a plan view showing the CMOS circuit according to the second and third embodiments of this invention and showing the arrangement of p-type regions and n-type regions in an element region.

As described above, according to the semiconductor device of the first to fourth embodiments of this invention, occurrence of the floating body effect can be suppressed in the analog CMOS circuit using the SOI substrate. Further, according to the semiconductor device of the second to fourth embodiments of this invention, by isolating the wiring layer used to connect a plurality of MOS transistors from the p-type region used to apply potential to the body regions without arranging them adjacent to one another, the wiring width of the wiring layer is made small. Therefore, the input capacitance of the CMOS circuit can be made small and the analog characteristic of the CMOS circuit can be enhanced. FIG. 34 is a plan view showing the CMOS circuit according to the second and third embodiments of this invention, shows the arrangement of p-type regions and n-type regions and shows the same regions as those of FIG. 14. That is, in the structure according to the second and third embodiments, n-type source regions 33 and drain regions 33 are formed in positions between adjacent gate electrodes in a p-type silicon layer 32 formed on the semiconductor substrate with an insulating film disposed therebetween. Further, in the semiconductor layer 32, regions lying directly below the gate electrodes and arranged between the source regions 33 and the drain regions 33 are used as p-type body regions. Further, the semiconductor layer 32 has a first region 32-1 and second regions 32-2 of a p-type. The first region 32-1 is a region lying directly below the wiring layer 21 which commonly connects the gate electrodes 20 and wiring layer 22 connected to the wiring layer 21 and is formed in contact with a plurality of body regions. The second regions 32-2 are formed separately from the source and drain regions 33 with the first region 32-1 disposed therebetween. A case of L2>L3 is explained in FIG. 19, but it is satisfactory if the length L2 of a region of the wiring layer 22 which overlaps with the semiconductor layer 32 in the Y direction is shorter than the length of a region of the wiring layer 21 which overlaps with the semiconductor layer 32 in the lengthwise direction, that is, the length L4 of the wiring layer 21 in the X direction.

Figure 35:
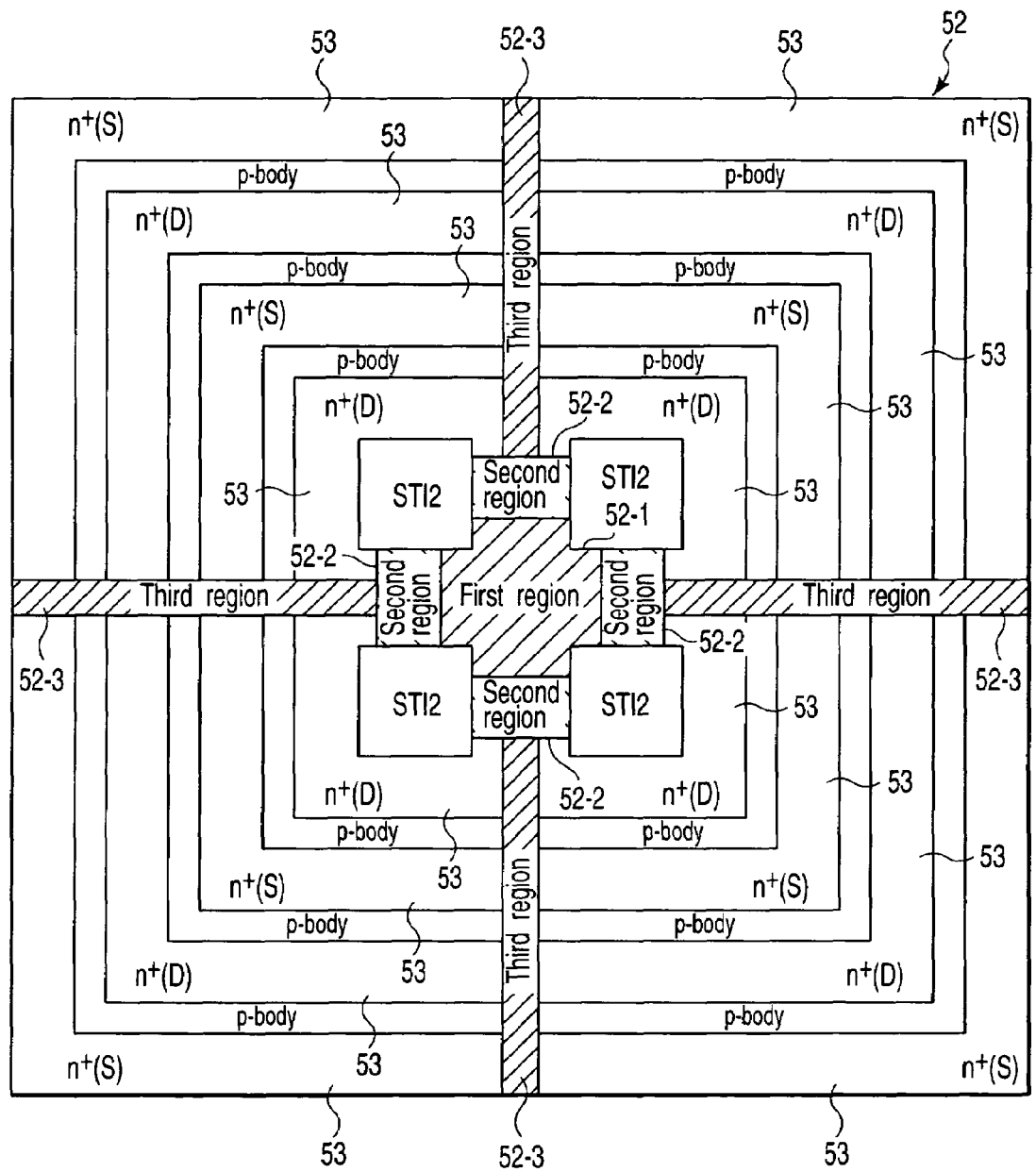
FIG. 35 is a plan view showing the CMOS circuit according to the fourth embodiment of this invention and showing the arrangement of p-type regions and n-type regions in an element region.

FIG. 35 is a plan view showing the CMOS circuit according to the fourth embodiment, shows the arrangement of p-type regions and n-type regions and shows the same regions as those of FIG. 30. That is, in the structure according to the fourth embodiment, a first region 52-1 of a p-type is formed in the central portion of a p-type silicon layer 52 formed on the semiconductor substrate with an insulating film disposed therebetween. Contact plugs CP3 are formed on the first region 52-1. Further, second regions 52-2 of the p-type are formed in contact with the first region 52-1 to surround the first region 52-1 around the first region 52-1. A plurality of gate electrodes 40 having a frame form to surround the first and second regions 52-1, 52-2 and formed in a nested structure on the silicon layer 52. Regions lying directly below the gate electrodes 40 are used as p-type body regions of the MOS transistors. Third regions 52-3 of the p-type are formed to radially extend from the second regions 52-2 to the exterior of the semiconductor layer 52. Wiring layers 41 are formed on the third regions 52-3. With the above structure, the body regions are electrically connected to the first region 52-1 via the second and third regions 52-2, 52-3. Further, the first region 52-1 is electrically isolated from the drain regions 53 by the presence of the second regions 52-2 and element isolation regions STI2.

Figure 36:
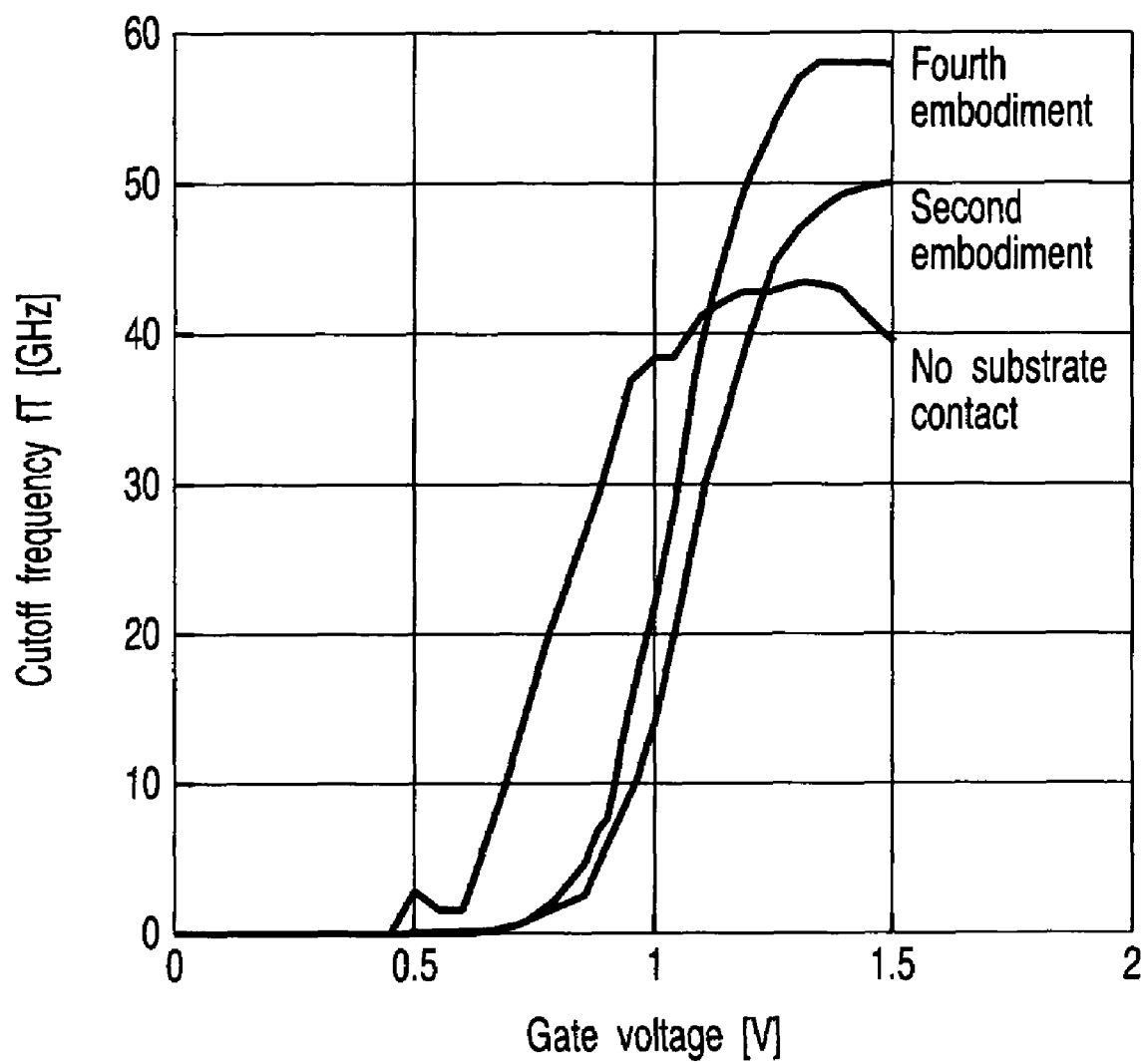
FIG. 36 is a graph showing a variation in the cutoff frequency of the CMOS circuit with respect to gate voltage.

FIG. 36 is a graph showing a variation in the cutoff frequency fT of the CMOS circuit with respect to gate voltage and shows a case wherein the structure in which contact plugs used to apply potential to the body regions are not formed (no substrate contact) and the structures according to the second and fourth embodiments are designed in the same condition. As shown in FIG. 36, the cutoff frequency is set to the lowest in the structure in which the potential of the body region is set in an electrically floating state and the most excellent analog characteristic can be obtained in the structure according to the fourth embodiment.

Figure 37:
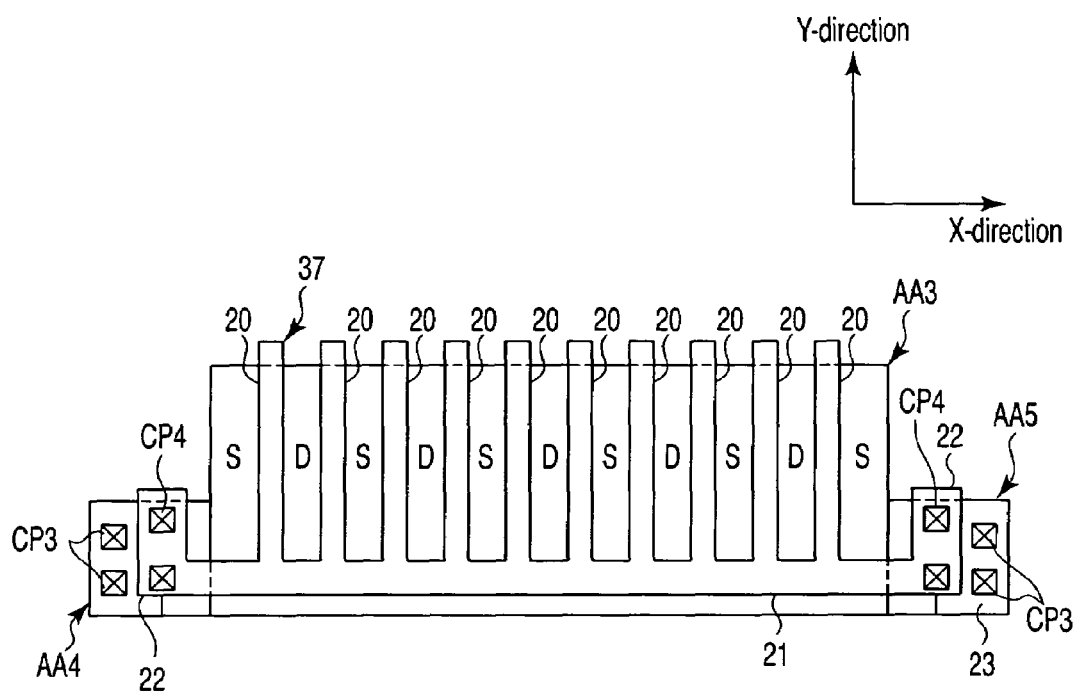
FIG. 37 is a plan view of the CMOS circuit according to the first modification of the first to third embodiments of this invention.
Figure 38:
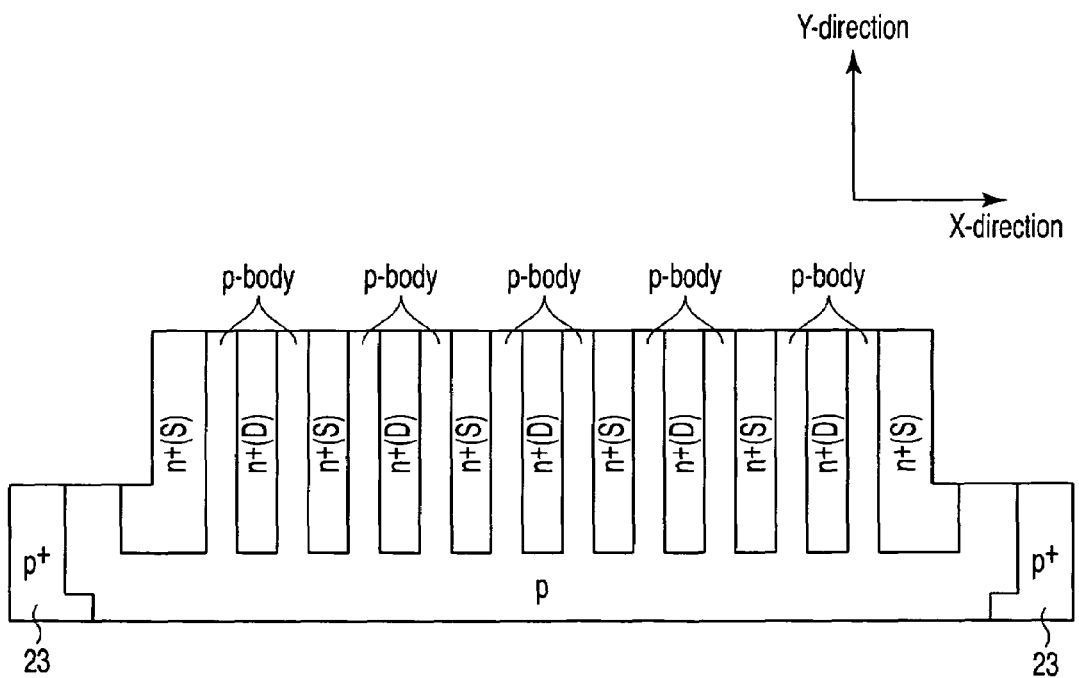
FIG. 38 is a plan view showing the CMOS circuit according to the first modification of the first to third embodiments of this invention and showing the arrangement of p-type regions and n-type regions in an element region.
Figure 39:
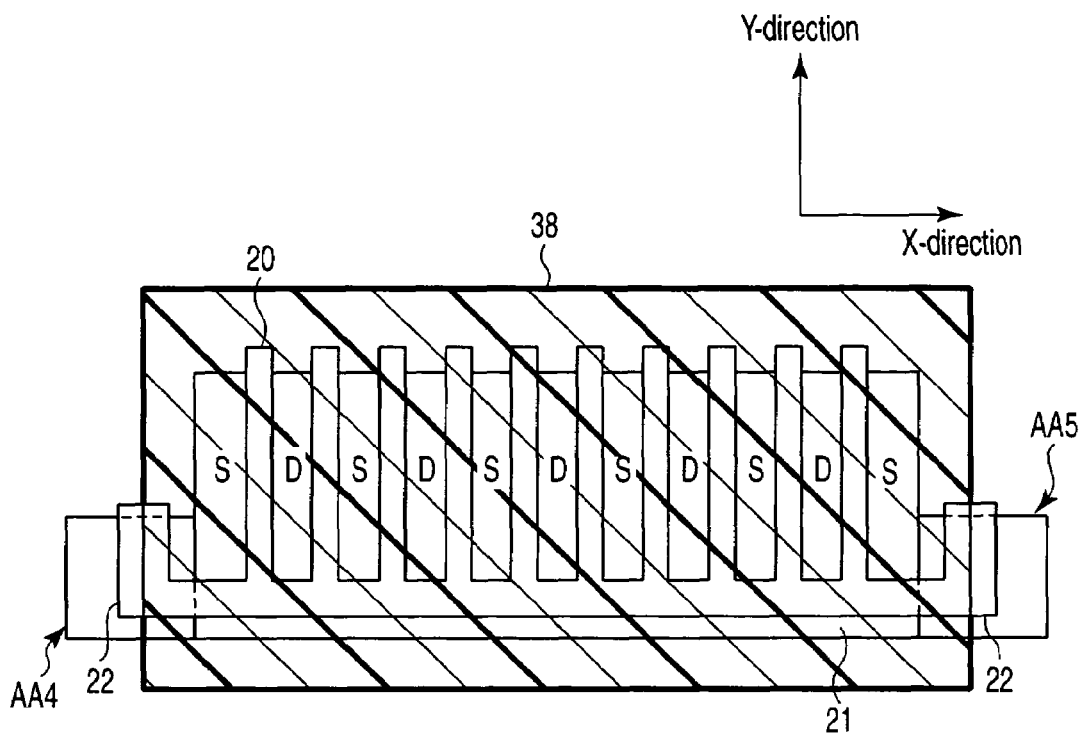
FIG. 39 is a plan view showing the CMOS circuit according to the first modification of the second and third embodiments of this invention and showing the state at the time of the ion-implantation process.
Figure 40:
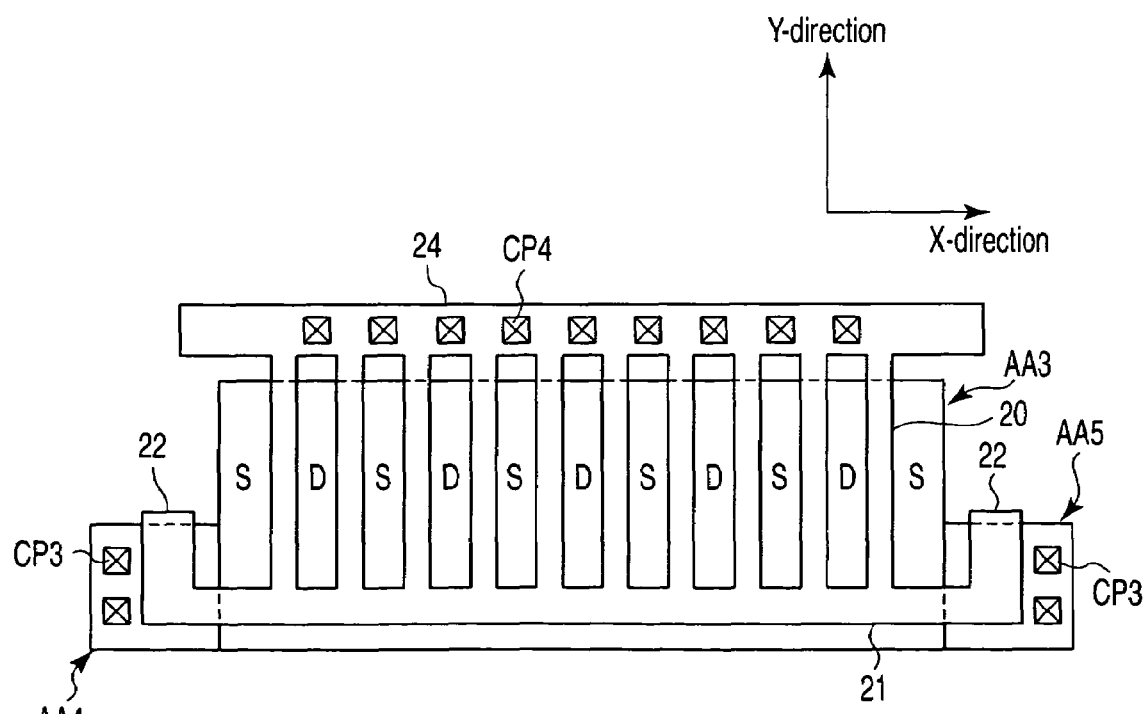
FIG. 40 is a plan view of the CMOS circuit according to the second modification of the second and third embodiments of this invention.

In the first to third embodiments, a case where the MOS transistors are formed on both sides of the wiring layers 11, 21 in the Y direction is explained, but the MOS transistors can be formed only on one side. FIG. 37 is a plan view of a CMOS circuit according to a first modification of the second and third embodiments, FIG. 38 shows the arrangement of p-type regions and n-type regions and FIG. 39 is a plan view showing the state of a mask member 38 at the time of formation of diffusion layers 23. As shown in the drawings, gate electrodes 20 are formed only on one side of the wiring layer 21. The diffusion layers 23 are connected to body regions via regions lying directly below the wiring layers 21, 22. Even with this structure, since the entire surface of the wiring layer 21 is covered with the mask member 38 as shown in FIG. 39, the wiring width of the wiring layer 21 can be made small and the same effect as that of the above embodiments can be attained. Further, as shown in the plan view of the CMOS circuit of FIG. 40, a wiring layer 24 can be formed like the third embodiment and contact plugs CP4 may be formed on the wiring layer 24 in the structure shown in FIG. 37.

Figure 41:
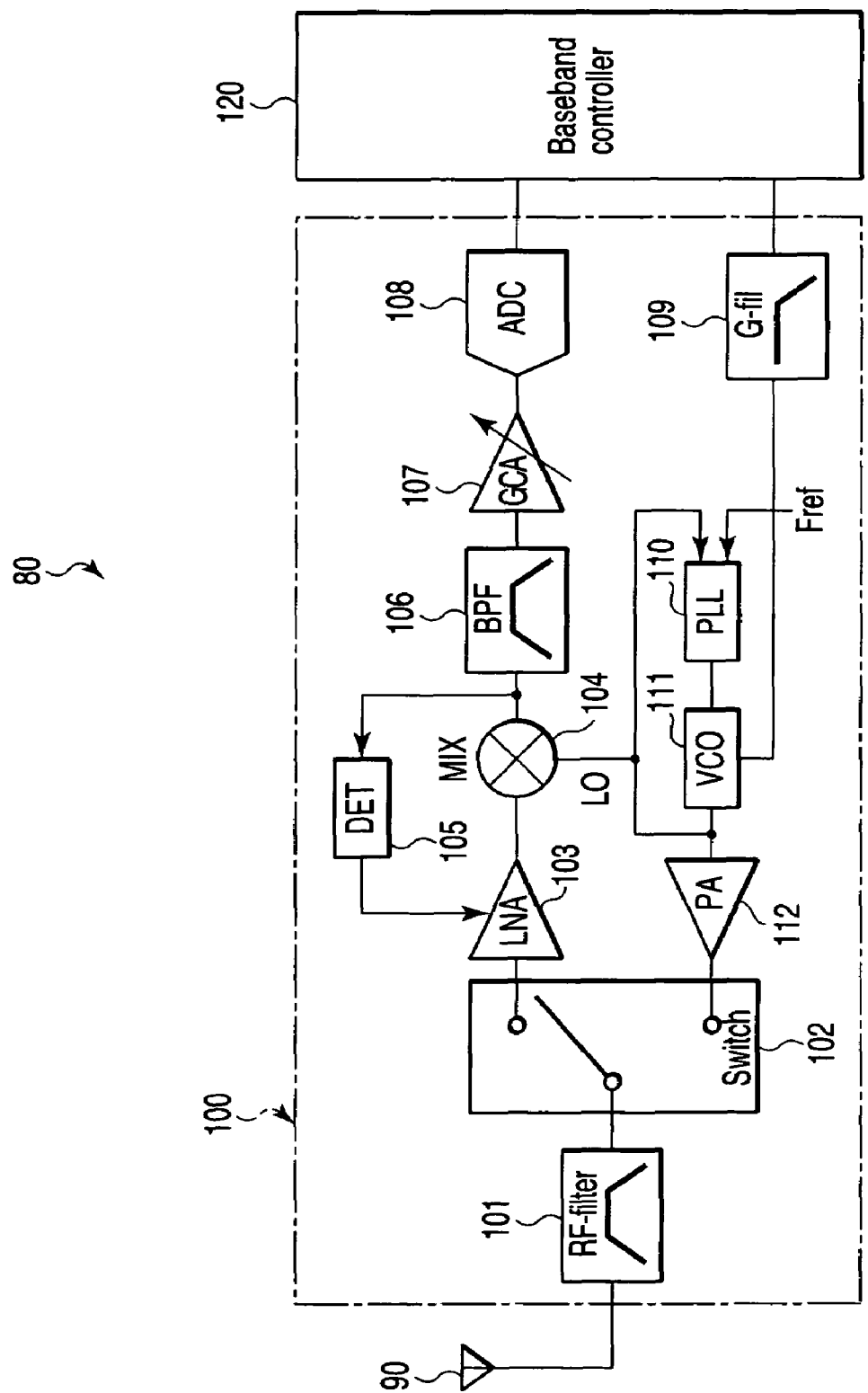
FIG. 41 is a block diagram showing a radio communication LSI having the CMOS circuit according to the first to fourth embodiments of this invention.

An application example of the CMOS circuit explained in the first to fourth embodiments is explained with reference to FIG. 41. FIG. 41 is a block diagram showing a radio communication LSI, for example, a short-range radio communication module. As shown in FIG. 41, a short-range radio communication module 80 includes an antenna 90, RF block 100 and baseband controller 120. The antenna 90 transmits and receives a radio signal. The baseband controller 120 performs data demodulation and modulation processes. The short-range radio communication module 80 is connected to home electrical appliances such as personal computers, PDA, printers, mobile telephones and TV receivers, for example, via an interface (not shown).

The RF block 100 includes an RF filter 101, RF switch 102, low-noise amplifier 103, mixer 104, intensity detection circuit 105, band-pass filter 106, gain control amplifier 107, A/D converter 108, Gaussian low-pass filter 109, PLL (Phase Locked Loop) circuit 110, voltage controlled oscillator circuit 111 and power amplifier 112.

At the time of data reception, a radio carrier wave signal (which is hereinafter referred to as an RF signal) arrived is received by the antenna 90 and then fetched into the RF block 100 via the RF filter 101. After this, the RF signal is supplied to the low-noise amplifier 103 via the switch 102 and the low-noise amplifier 103 amplifies the signal intensity of the RF signal. The RF signal amplified by the low-noise amplifier 103 is mixed with a local signal LO output from the voltage controlled oscillator circuit 111 in the mixer 103 and down-converted into an intermediate frequency IF. The band-pass filter 106 permits only a specified channel frequency band among the RF signal (IF signal) down-converted into the intermediate frequency IF to pass therethrough. Then, the gain control amplifier 107 controls the signal amplitude of the IF signal which has passed through the band-pass filter 106 so as to set the same into a dynamic range of the A/D converter 108. Next, the A/D converter 108 converts the IF signal into a digital signal. The IF signal sampled by the A/D converter 108 is supplied to the baseband controller 120 which performs the baseband process and the baseband controller 120 demodulates the IF signal. The intensity detection circuit 105 controls the degree of amplification in the low-noise amplifier 103 according to the intensity of the IF signal.

At the time of data transmission, the baseband controller 120 transfers digital data to the Gaussian low-pass filter 109 which in turn suppresses the high-frequency component of the digital data. Then, an output of the Gaussian low-pass filter 109 is supplied to the modulation terminal of the voltage controlled oscillator circuit 111. The voltage controlled oscillator circuit 111 modulates the output frequency of the oscillation signal based on the output of the Gaussian low-pass filter 109. The output frequency of the voltage controlled oscillator circuit 111 is previously set at a preset channel frequency by the PLL circuit 110. The oscillation signal output from the voltage controlled oscillator circuit 111 is amplified to desired power by the power amplifier 112 and then transmitted from the antenna 90 via the RF switch 102 and RF filter 101. In the radio communication system, the intensity of radio waves markedly varies depending on the distance between the transmitter and the receiver. Therefore, the intensity detection circuit 105 adjusts the amplification factor of the low-noise amplifier 103 according to the intensity of the received signal to stabilize the signal intensity of the IF signal.

FIG. 42 is a circuit diagram of the low-noise amplifier 103. As shown in FIG. 42, the low-noise amplifier 103 includes resistor elements 130, 131, n-channel MOS transistors 132, 133 and current source circuit 134. One-side ends of the resistor elements 130, 131 are connected to a node of power supply voltage Vdd and the other ends thereof are respectively connected to the drains of the MOS transistors 132, 133. The sources of the MOS transistors 132, 133 are connected to the current source circuit 134 and the gates thereof are respectively applied with positive input voltage Vin(+) and negative input voltage Vin(−) from the RF switch 102. Drain potentials of the MOS transistors 132, 133 are output as output voltages.

FIG. 43 is a circuit diagram of the power amplifier 112. As shown in FIG. 43, the power amplifier 112 includes a resistor element 135 and n-channel MOS transistor 136. One end of the resistor element 135 is connected to the node of power supply voltage Vdd and the other end thereof is connected to the drain of the MOS transistor 136. The source of the MOS transistor 136 is grounded and the gate thereof is applied with positive input voltage Vin(+) from the voltage controlled oscillation circuit 111.

It is preferable to apply the CMOS circuits explained in the first to fourth embodiments as the MOS transistors 132, 133, 136 of the low-noise amplifier 103 and power amplifier 112 with the above configurations. This is because, particularly, the low-noise amplifier 103 and power amplifier 112 deal with the high-frequency signal in the RF block 100.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a first insulating film formed on a semiconductor substrate;
a plurality of first semiconductor layers of a first conductivity type separately formed on the first insulating film;
a plurality of second semiconductor layers of a second conductivity type which is opposite to the first conductivity type, formed on the first insulating film, each disposed between adjacent ones of the first semiconductor layers and formed in contact with the first semiconductor layers;
a third semiconductor layer of the second conductivity type formed on the first insulating film and formed in contact with the plurality of second semiconductor layers;
a plurality of gate electrodes formed on the second semiconductor layers with gate insulating films interposed therebetween;
a first wiring layer formed on the third semiconductor layer with a second insulating film interposed therebetween and commonly connecting the plurality of gate electrodes;
a fourth semiconductor layer of the second conductivity type formed on the first insulating film, the fourth semiconductor layer being in contact with at least the third semiconductor layer, a length of the fourth semiconductor layer in a lengthwise direction being smaller than a length of the third semiconductor layer in a lengthwise direction;
a fifth semiconductor layer of the second conductivity type formed on the first insulating film and isolated from the first semiconductor layers by the fourth semiconductor layer, the fifth semiconductor layer being in contact with the fourth semiconductor layer, the first to fifth semiconductor layers being electrically isolated from the semiconductor substrate by the first insulating film;
a second wiring layer formed on the fourth semiconductor layer with a third insulating film interposed therebetween; and
a first contact plug formed on the fifth semiconductor layer.

2. The device according to claim 1, further comprising a element isolation region formed on the first insulating film,
wherein the second wiring layer lies over, and extends, from the fourth semiconductor layer to the element isolation region.

3. The device according to claim 1, further comprising:
an element isolation region formed on the first insulating film,
a third wiring layer formed on the element isolation region and connected to the first wiring layer, and
a second contact plug formed on the third wiring layer and applied with a gate potential.

4. The device according to claim 1, wherein a width of the first wiring layer is smaller than a width of the second wiring layer.

5. The device according to claim 1, further comprising an element isolation region formed on the first insulating film and surrounding the first to fifth semiconductor layers, wherein each of the gate electrodes has a stripe form extending in a first direction from one end portion of the second semiconductor layer to the other end portion thereof, the first wiring layer has a stripe form extending in a second direction perpendicular to the first direction, and the second wiring layer is in contact with at least one end of the first wiring layer in the second direction and arranged substantially in parallel to the gate electrodes from one end portion of the fourth semiconductor layer to the other end portion thereof.

6. The device according to claim 5, wherein the first, second, fourth, and fifth semiconductor layers are arranged symmetrically with respect to the third semiconductor layer.

7. The device according to claim 1, further comprising an element isolation region formed on the first insulating film and surrounding the first to fifth semiconductor layers,
wherein the gate electrodes have one of a polygonal frame shape, a circular frame shape and a elliptical frame shape and arranged in a nested structure surrounding the fourth and fifth semiconductor layers, and the first wiring layer radially disposed at an outside of the fourth and fifth semiconductor layers.

8. The device according to claim 7, wherein the gate electrodes are concentrically arranged.

9. The device according to claim 1, further comprising a second contact plug formed on the second wiring layer and applied with a gate potential.

10. A semiconductor device having a plurality of MOS transistor units formed in one element region, adjacent ones of the MOS transistor units commonly using one of source and drain regions and gate electrodes thereof being commonly connected, comprising:
a first insulating film formed on a semiconductor substrate;
a semiconductor layer formed on the first insulating film and electrically isolated from the semiconductor substrate;
a plurality of the gate electrodes each having a stripe form extending in a first direction and formed in parallel on the semiconductor layer with gate insulating films interposed therebetween;
a first wiring layer having a stripe form extending in a second direction perpendicular to the first direction and formed on the semiconductor layer with a second insulating film interposed therebetween, the first wiring layer commonly connecting the plurality of gate electrodes;
a second wiring layer formed on the semiconductor layer with a third insulating film interposed therebetween, formed in contact with at least one end of the first wiring layer in the second direction and arranged substantially in parallel to the gate electrodes, a length of a region of the second wiring layer which overlaps with the semiconductor layer in a lengthwise direction being smaller than a length of a region of the first wiring layer which overlaps with the semiconductor layer in a lengthwise direction;
the source and drain regions formed in portions of the semiconductor layer which lie between adjacent ones of the gate electrodes and formed to extend to the first insulating film;
a first region having the same conductivity type as that of body regions of the MOS transistor units and formed in a portion of the semiconductor layer which lies directly below the first and second wiring layers;
a second region having the same conductivity type as that of the first region, formed in the semiconductor layer and isolated from the source and drain regions with the first region interposed therebetween; and a first contact plug formed on the second region.

11. The device according to claim 10, wherein the gate electrodes and the second wiring layer are arranged symmetrically with respect to the first wiring layer.

12. The device according to claim 10, further comprising an element isolation region formed on the first insulating film, a third wiring layer formed on the element isolation region and connected to the first wiring layer, and a second contact plug formed on the third wiring layer and applied with a gate potential.

13. The device according to claim 10, wherein a width of the first wiring layer is smaller than a width of the second wiring layer.

14. The device according to claim 10, wherein a length of a region of any one of the gate electrodes which overlaps with the semiconductor layer in a lengthwise direction is substantially equal to a length of a region of the second wiring layer which overlaps with the semiconductor layer in a lengthwise direction.

15. The device according to claim 10, further comprising a second contact plug formed on the second wiring layer and applied with a gate potential.

* * * * *